(12) United States Patent
Davis et al.

(10) Patent No.: US 10,889,263 B2
(45) Date of Patent: Jan. 12, 2021

(54) PASSENGER SAFETY SYSTEM

(71) Applicant: Jason J. Davis, Lancaster, TX (US)

(72) Inventors: Jason J. Davis, Lancaster, TX (US); Edgar Vela, Plano, TX (US); Uriel Romero, Garland, TX (US); Isaac Juarez, Cedar Hill, TX (US); Jorge Villa, Garland, TX (US); Catarino Almeida, Richardson, TX (US)

(73) Assignee: Jason J. Davis, Lancaster, TX (US)

( * ) Notice: Subject to any disclaimer, the term of this patent is extended or adjusted under 35 U.S.C. 154(b) by 0 days.

(21) Appl. No.: 16/382,947

(22) Filed: Apr. 12, 2019

(65) Prior Publication Data

US 2019/0329731 A1  Oct. 31, 2019

Related U.S. Application Data

(60) Provisional application No. 62/663,170, filed on Apr. 26, 2018.

(51) Int. Cl.
| | | |
|---|---|---|
| *B60R 22/48* | (2006.01) | |
| *B60R 22/10* | (2006.01) | |
| *B60R 22/12* | (2006.01) | |
| *B60R 22/18* | (2006.01) | |
| *G01R 31/36* | (2020.01) | |
| *G01K 3/00* | (2006.01) | |
| *G01D 5/14* | (2006.01) | |
| *H04W 4/40* | (2018.01) | |

(52) U.S. Cl.
CPC ............ *B60R 22/48* (2013.01); *B60R 22/105* (2013.01); *B60R 22/12* (2013.01); *B60R 22/18* (2013.01); *G01D 5/142* (2013.01); *G01K 3/005* (2013.01); *G01R 31/3646* (2019.01); *H04W 4/40* (2018.02); *B60R 2022/4816* (2013.01); *B60R 2022/4866* (2013.01)

(58) Field of Classification Search
CPC ....... B60R 22/48; B60R 22/105; B60R 22/12; B60R 22/18; H04W 4/40; G01R 31/3646; G01D 5/142; G01K 3/005
USPC ........................................................ 340/457.1
See application file for complete search history.

(56) References Cited

U.S. PATENT DOCUMENTS

| | | |
|---|---|---|
| 6,480,103 B1 | 11/2002 | McCarthy et al. |
| 6,485,081 B1 | 11/2002 | Bingle et al. |
| 6,922,154 B2 | 7/2005 | Kraljic et al. |
| 9,139,162 B1 | 9/2015 | Whitby et al. |
| 10,131,318 B2* | 11/2018 | Davis .................. G08B 25/08 |
| 10,407,021 B2* | 9/2019 | Davis ................ G08B 21/0225 |
| 2002/0161501 A1 | 10/2002 | Dulin et al. |
| 2004/0195449 A1* | 10/2004 | Cordina ............. B64D 45/0059 |
| | | 244/118.5 |

(Continued)

OTHER PUBLICATIONS

U.S. Appl. No. 15/444,270, Notice of Allowance, dated Jul. 18, 2018, 10 pgs.

(Continued)

*Primary Examiner* — Kerri L McNally
(74) *Attorney, Agent, or Firm* — Foley & Lardner LLP

(57) ABSTRACT

Disclosed is a system and method for passenger safety. A sensing unit, remote device, and/or fob may interoperate to provide various alerts and other indications representative of aspects of a context environment proximate to a sensing unit. In this manner, passenger safety may be enhanced.

8 Claims, 18 Drawing Sheets

(56) References Cited

U.S. PATENT DOCUMENTS

| | | | |
|---|---|---|---|
| 2004/0227638 A1* | 11/2004 | Frank | B60R 22/48 |
| | | | 340/687 |
| 2007/0013531 A1 | 1/2007 | Hules et al. | |
| 2007/0182535 A1 | 8/2007 | Seguchi | |
| 2012/0256743 A1* | 10/2012 | Horton | G08B 21/0244 |
| | | | 340/539.13 |
| 2013/0021476 A1* | 1/2013 | Trummer | B60R 22/48 |
| | | | 348/148 |
| 2013/0109342 A1 | 5/2013 | Welch | |
| 2014/0253314 A1 | 9/2014 | Rambadt et al. | |
| 2014/0266694 A1 | 9/2014 | McCluskey et al. | |
| 2017/0043714 A1* | 2/2017 | Lewis-Cheeks | B60N 2/002 |
| 2017/0046937 A1 | 2/2017 | Chacon et al. | |
| 2017/0120813 A1* | 5/2017 | Wilson | B60Q 9/00 |
| 2019/0084524 A1 | 3/2019 | Davis | |
| 2019/0389423 A1 | 12/2019 | Davis | |

OTHER PUBLICATIONS

U.S. Appl. No. 16/195,270, Non-Final Office Action, dated Jan. 24, 2019, 21 pgs.

U.S. Appl. No. 16/195,270, Notice of Allowance, dated May 13, 2019, 11 pgs.

U.S. Appl. No. 16/195,270, Notice of Allowance dated Jul. 16, 2019, 9 pgs.

U.S. Appl. No. 16/565,015, Non-Final Office Action, dated Jul. 22, 2020, 30 pgs.

U.S. Appl. No. 16/382,947, filed Apr. 12, 2019, Passenger Safety System.

* cited by examiner

PASSENGER SAFETY SYSTEM

CROSS-REFERENCE TO RELATED APPLICATIONS

This application claims the benefit of and priority to U.S. Prov. Pat. App. No. 62/663,170, filed on Apr. 26, 2018, the disclosure of which is hereby incorporated by reference in its entirety.

FIELD

The present disclosure relates generally to a passenger safety system for improving safety of an individual secured in a seat.

BACKGROUND

The statements in this section merely provide background information related to the present disclosure and may not constitute prior art. Frequently, individuals may be secured in a seat. For instance, passengers in a vehicle, or wheelchair, or other seat. Such individuals may encounter risks associated with their securement in the seat. Thus there exists a need for a passenger safety system as discussed herein.

SUMMARY

A passenger safety system is provided. In various aspects, various features include elements as disclosed herein.

A passenger safety system is provided. The system may include a sensing unit and a fob. The sensing unit may be configured to be installed proximate to a seat occupiable by a person. In various embodiments, the sensing unit is a part of a securement system for securing the person in the seat. The fob may include a portable electronic device to provide human readable indications corresponding to radio signals from the sensing unit received via a fob communication channel. In various embodiments, the fob indicates at least one of a securement of a seat belt associated with the sensing unit, a temperature proximate to the sensing unit, and a distance of the fob from the sensing unit in response to the radio signals.

The fob communication channel may be a Bluetooth connection. The fob communication channel may be a cellular connection. The sensing unit may be a portion of a child safety seat. The sensing unit may be interstitially connectable between a conjugate slot and tab of a seat belt connection, the sensing unit configured to determine whether the conjugate slot and tab are both properly fastened to a housing of the sensing unit.

In various embodiments, the sensing unit is further configured for operative communication with a remote device including a smart phone via a remote device communication channel including a cellular connection. The remote device may indicate at least one of the securement of the seat belt associated with the sensing unit, the temperature proximate to the sensing unit, and the distance of the remote device from the sensing unit.

Moreover, the fob may include a fob transceiver, a fob controller, and a transceiver power controller. The fob transceiver may be configured to send and receive the radio signals to and from the sensing unit via the fob communication channel. The fob controller may be connected to the fob transceiver and configured to detect a loss of communication of the fob transceiver with the sensing unit. The transceiver power controller may be configured to increase a transmitter power of the fob transceiver in response to the detected loss of communication of the fob transceiver with the sensing unit, whereby the fob transceiver regains communication with the sensing unit. The fob controller may provide a human readable indication that the fob has exceeded a predetermined range from the sensing unit in response to the loss of communication.

The fob may include an indicator array. The indicatory array may include a battery indicator, an attachment indicator, a temperature indicator, and a fob range indicator. The battery indicator may be configured to provide an indication of whether a battery of the fob is charged beyond a battery charge threshold. The attachment indicator may be configured to provide an indication of whether one or more sensors of the sensing unit indicate the securement of a seat belt associated with the sensing unit. The temperature indicator may be configured to provide an indication of whether a temperature proximate to the sensing unit is within an acceptable range. The fob range indicator may be configured to provide an indication of whether the fob has exceeded a predetermined range from the sensing unit.

The sensing unit may include a first attachment mechanism, a second attachment mechanism, a housing, and an attachment mechanism sensor array. The first attachment mechanism may be a first shoulder strap of a child safety seat. The second attachment mechanism may be a second shoulder strap of a child safety seat. The housing may be selectively connectable to the first attachment mechanism and the second attachment mechanism and may have a release button configured to selectively disconnect the first attachment mechanism and the second attachment mechanism from the housing. The attachment mechanism sensor array may be disposed in the housing to determine whether the first attachment mechanism is disconnected and to determine whether the second attachment mechanism is disconnected.

The attachment mechanism sensor array may include Hall-Effect sensors to determine whether the first attachment mechanism is disconnected and to determine whether the second attachment mechanism is disconnected.

The sensing unit may include a temperature sensor. The sensing unit may include fob proximity sensor, wherein the fob proximity sensor has a Bluetooth transceiver configured to detect a loss of connection with a Bluetooth transceiver of the fob. The sensing unit further may include a sensing unit indicator array having LEDs selectably illuminable to indicate whether the first attachment mechanism is disconnected and whether the second attachment mechanism is disconnected.

A sensing unit of a passenger safety system is provided The sensing unit may include a first attachment mechanism, a second attachment mechanism, a housing, an attachment mechanism sensor array, and a radio transmitter. The first attachment mechanism may include a first shoulder strap of a child safety seat. The second attachment mechanism may include a second shoulder strap of a child safety seat. The housing may be selectively connectable to the first attachment mechanism and the second attachment mechanism and may have a release button configured to selectively disconnect the first attachment mechanism and the second attachment mechanism from the housing. The attachment mechanism sensor array may be disposed in the housing to determine whether the first attachment mechanism is disconnected and to determine whether the second attachment mechanism is disconnected. The radio transmitter may be configured to wirelessly communicate to at least one of a fob and a smartphone whether the first attachment mechanism is disconnected and to whether the second attachment mechanism is disconnected.

In various embodiments, the attachment mechanism sensor array includes Hall-Effect sensors to determine whether the first attachment mechanism is disconnected and to determine whether the second attachment mechanism is disconnected. In various embodiments, the sensing unit further includes a temperature sensor, and the radio transmitter is further configured to wirelessly communication to at least one of a fob and a smartphone whether a temperature proximate to the child safety seat is within a predetermined acceptable range.

Moreover, the sensing unit may include a sensing unit indicator array having LEDs selectably illuminable to indicate whether the first attachment mechanism is disconnected and whether the second attachment mechanism is disconnected.

A passenger safety system is provided. The passenger safety system may include a sensing unit configured to be installed proximate to a seat occupiable by a person, wherein the sensing unit is a part of a securement system for securing the person in the seat via a seatbelt. The sensing unit may include an attachment mechanism sensor, a temperature sensor, and a radio transmitter. The attachment mechanism sensor may be disposed in the housing to determine whether the seatbelt is properly fastened to the housing of the sensing unit. The temperature sensor may measure a temperature proximate to the sensing unit. The radio transmitter may be configured for operative communication with a remote device such as a smart phone. The radio transmitter provides a radio transmission to the remote device including an indication of at least one of the securement of the seat belt associated with the sensing unit, the temperature proximate to the sensing unit, and the distance of the sensing unit from the remote device.

In various embodiments, the attachment mechanism sensor is a Hall-Effect sensor to determine whether the seatbelt is properly fastened to the housing of the sensing unit. In various embodiments, the sensing unit is interstitially connectable between a conjugate slot and tab of a seat belt connection, the sensing unit configured to determine whether the conjugate slot and tab are both properly fastened to the housing of the sensing unit.

BRIEF DESCRIPTION OF THE DRAWINGS

For a more complete understanding of various embodiments of the present disclosure and the advantages thereof, reference is now made to the following brief description, taken in connection with the accompanying drawings and detailed description, wherein like reference numerals represent like parts, and in which.

DETAILED DESCRIPTION

Figure 1A:
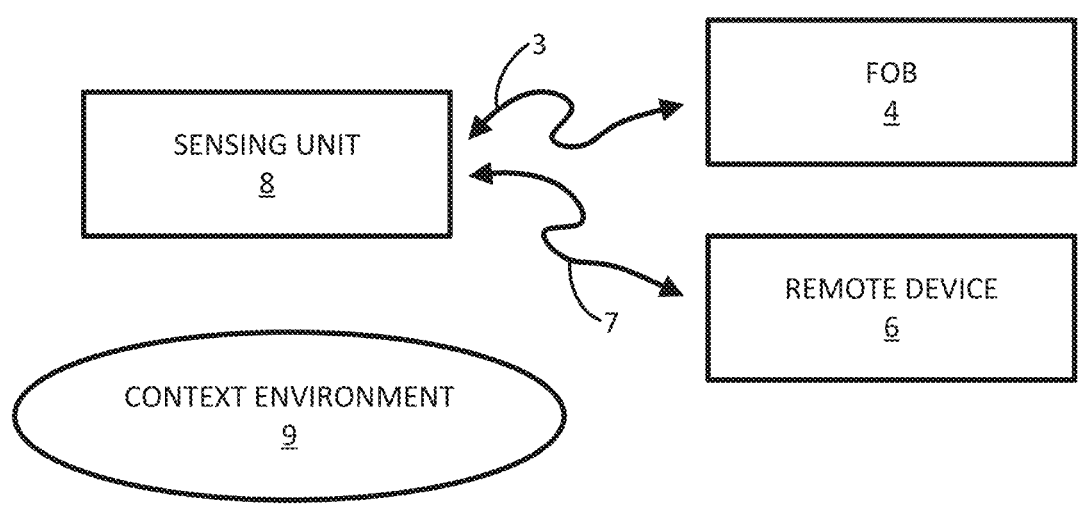
FIG. 1A illustrates a passenger safety system, in accordance with various embodiments.

The present disclosure is generally described in detail with reference to embodiments illustrated in the drawings. However, other embodiments may be used and/or other changes may be made without departing from the spirit or scope of the present disclosure. The illustrative embodiments described in the detailed description are not meant to be limiting of the subject matter presented herein.

Reference will now be made to the exemplary embodiments illustrated in the drawings, and specific language will be used to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

This disclosure generally relates to passenger safety in seats. For instance, a child, elderly person, or other passenger in a seat, such as a vehicle seat, wheelchair seat, or amusement park ride seat, or any other seat may be subject to improper buckling, unbuckling, overheating, and/or being abandoned in the seat. The individual seated in the seat and aspects of the seat and surrounding environment, such as temperature, may be termed a "context environment." Alert systems may be useful to alert another person of various conditions detected with respect to the context environment potentially needing amelioration. The disclosure further relates to seats outside of a car or other vehicle. For example, a child seat that is being carried, a stroller, a high chair, or other context environment.

With reference to FIG. 1A, a passenger safety system 2 may comprise various aspects as disclosed herein. For instance, a sensing unit 8 may be installed proximate to a seat occupiable by a person. In various instances, the sensing unit 8 is a part of a securement system for securing a person in the seat, such as a seat belt. In various instances, the sensing unit 8 may be integrated into aspects of the seat, such as a child safety seat. For instance, a sensing unit 8 may be a part of the buckle and strap system to retain the child in the seat. In this manner, the sensing unit 8 may be implemented with respect to the seat whether the seat is in a stroller, or a vehicle, or being carried and/or the like. In further instance, a sensing unit may be interstitially connectable between conjugate buckling pieces of an extant safety belt. For instance, for an adult traveling in a vehicle with onboard seat belts, an extant seat belt of the vehicle maybe buckled to the sensing unit 8, which may then be buckled to a corresponding receptacle of the vehicle into which the extant seat belt typically inserts and/or joins. In this manner, the sensing unit 8 may be portably implemented without altering the extant vehicle systems.

The sensing unit 8 may be configured for operative communication with a fob 4 via a fob communication channel 3. In various instances, the fob 4 comprises a portable electronic device configured for carrying in a pocket, or on a key chain, or mounted to a dash, or otherwise human accessible and human readable. The fob 4 may provide human readable indications corresponding to communication with the sensing unit 8 such as to indicate the securement of the seat belt associated with the sensing unit 8, a temperature of the context environment 9 proximate to the sensing unit 8, a distance or a threshold range being satisfied with respect to the proximity of the sensing unit 8 to the fob 4, a remaining battery life indication of a battery of the sensing unit 8 and/or fob 4, and/or an "all clear" indication indicating that the fob is sufficiently near the sensing unit 8, the sensing unit 8 is properly secured, the temperature of the context environment 9 is within a threshold, and a battery of the sensing unit 8 and/or fob 4 is adequately charged.

The sensing unit 8 may be configured for operative communication with a remote device 6 via a remote device communication channel 7. In various instances a remote device 6 comprises a smart phone, or cellular phone, or a browser session running on another device, and/or an application installed on a smart phone, cellular phone, or other device. In various instances, the remote device communication channel 7 may comprise at least a portion of a cellular or Wi-Fi communication network. In various instances, the remote device 6 comprises a portable electronic device configured for carrying in a pocket, or on a key chain, or mounted to a dash, or otherwise human accessible and human readable. The remote device 6 may provide human readable indications corresponding to communication with the sensing unit 8 such as to indicate the securement of the seat belt associated with the sensing unit 8, a temperature of the context environment 9 proximate to the sensing unit 8, a distance or a threshold range being satisfied with respect to the proximity of the sensing unit 8 to the remote device 6 and/or to the fob 4, a remaining battery life indication of a battery of the sensing unit 8 and/or fob 4 and/or remote device 6, and/or an "all clear" indication indicating that the fob 4 and/or remote device 6 is sufficiently near the sensing unit 8, the sensing unit 8 is properly secured, the temperature of the context environment 9 is within a threshold, and a battery of the sensing unit 8 and/or fob 4 and/or remote device 6 is adequately charged.

In various embodiments, one or more of fob 4, sensing unit 8, and remote device 6 may provide further communications comprising indications to a user regarding a state of the sensing unit 8 and other aspects of the system and similarly, further communications comprising instructions or acknowledgements from a user regarding the state of the sensing unit 8 and other aspects of the system or instructing a state change of the sensing unit 8 or other aspects to occur. For example, a provided communication may include an audible presence detection confirmation that confirms via a sound that a child or other person is in a seat having a sensing unit 8. A provided communication may include an indication that an action by a user is required to activate the system (e.g., start the sensing unit 8 monitoring the context environment and/or presence of a child or other person). The fob, sensing unit 8, remote device 6 or other aspect of the system may provide this action to activate the system (such as by a button press action). A provided communication may further include an indication acknowledging receipt of the action by the user to activate the system. Further provided communications may include a notification to a user reminding of the ending of a trip, or an audible notification that a child or other person is present in the seat having the sensing unit 8 and should be removed therefrom, such as at the end of the trip. Moreover, a provided notification may include an indication that an end-of-trip user action is required, for instance, a button press action by a user confirming that a trip is concluded. A provided communication may include an indication that a child or other person has been left behind in a seat having a sensing unit 8. Such an indication may be provided to further recipients or multiple remote devices 6, such as by SMS or other messaging technology. A provided communication may also include a communication from the fob, sensing unit 8, remote device 6 or other aspect of the system to cancel the indication that a child or other person has been left behind, such as to silence an alert after the child or other person has been removed from the seat, or further, a provided communication may include a communication from the sensing unit 8 to the fob or remote device 6 to cancel an alert that a child or other person has been left behind, for instance, upon removal of the child or other person. A provided communication may include an indication corresponding to a temperature of a child or other person and/or an alert indicating that a child or other person has a fever. Finally, in various embodiments, a provided communication may include an instruction to snooze alerts or an indication that alerts may be pending but have been snoozed. Thus one may appreciate that various one way communications and/or two way communications are contemplated. Provided communications may be via the various claimed indicator arrays, via annunciators, via phone call or text messaging systems, or any user interface mechanism as desired.

Figure 1B:
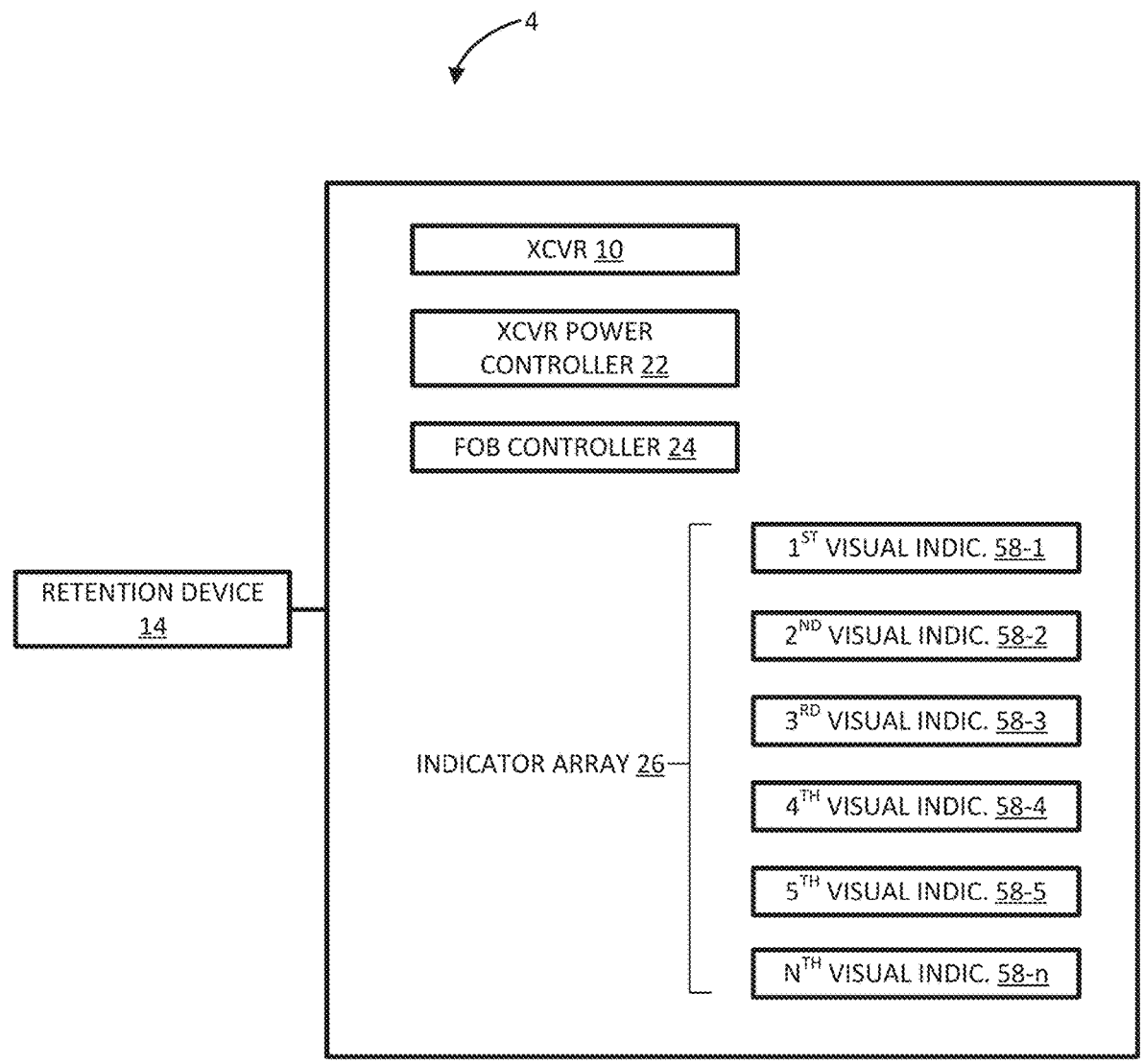
FIG. 1B illustrates aspects of a fob of a passenger safety system, in accordance with various embodiments.
Figure 3:
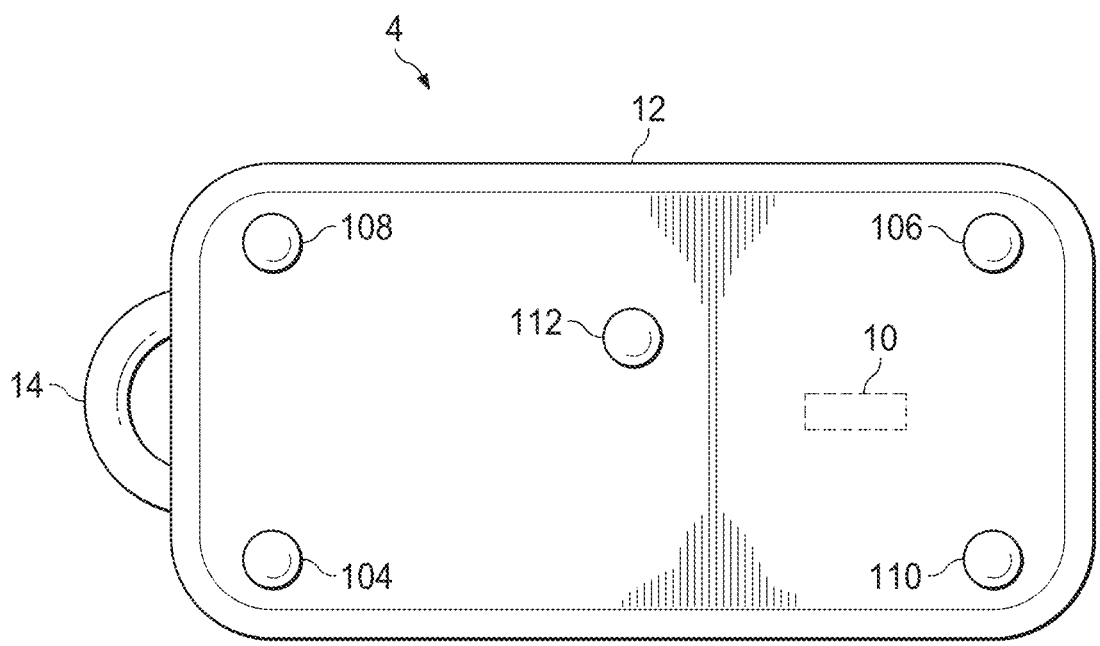
FIG. 3 illustrates an example embodiment of the fob of the passenger safety system, in accordance with various embodiments.
Figure 4:
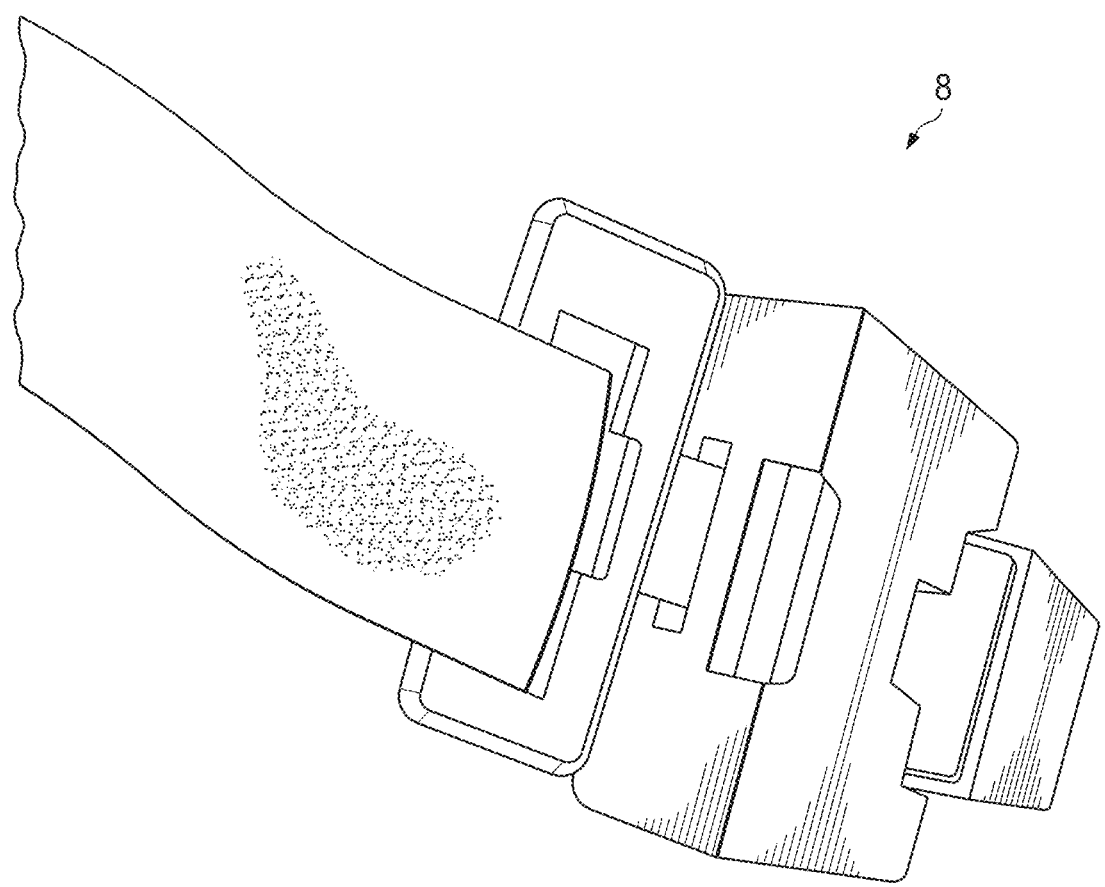
FIG. 4 illustrates a further example embodiment of a further sensing unit of the passenger safety system, in accordance with various embodiments.
Figure 5:
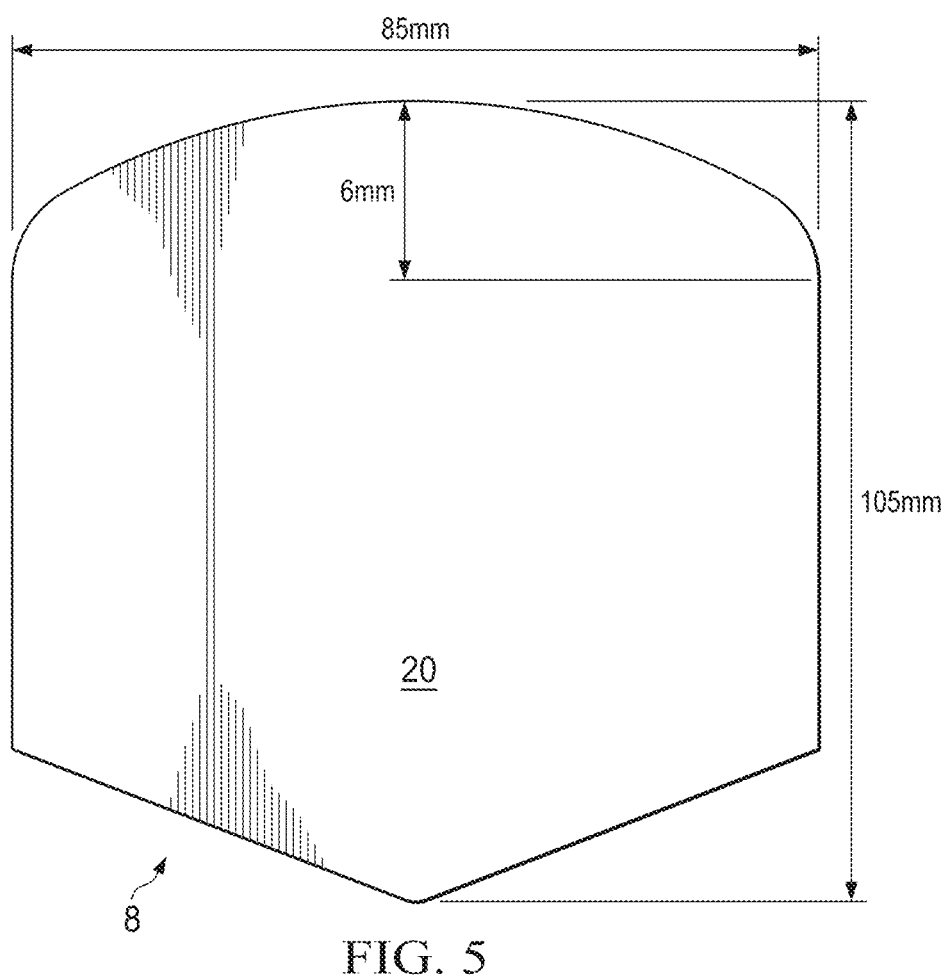
FIG. 5 illustrates aspects of an example housing of the sensing unit, in accordance with various embodiments.
Figure 6A:
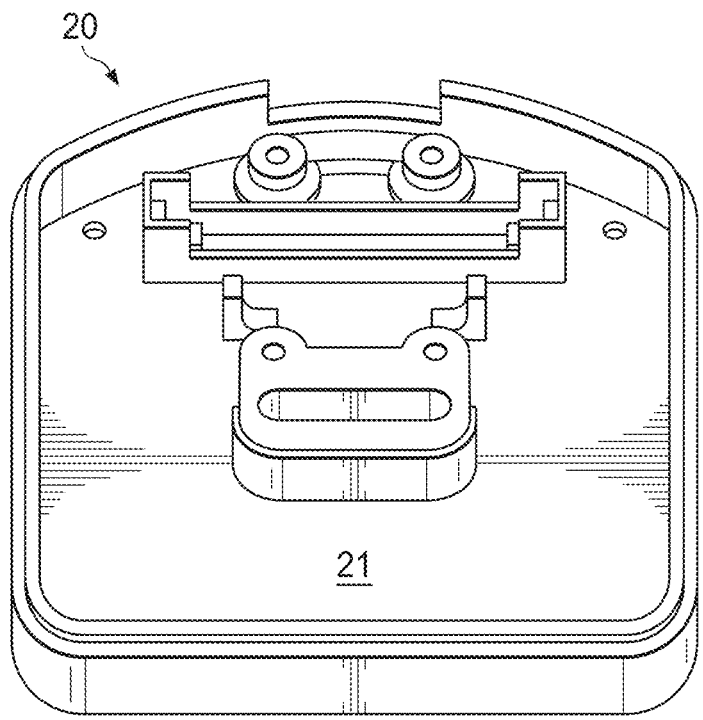
FIGS. 6A-B illustrate aspects of an interior of an example housing of the sensing unit.
Figure 6B:
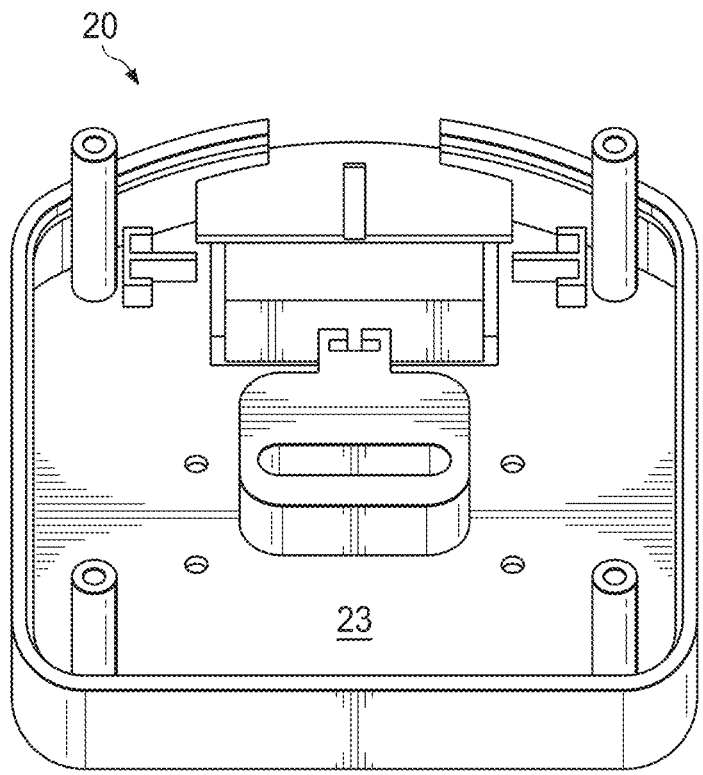
Figure 7A:
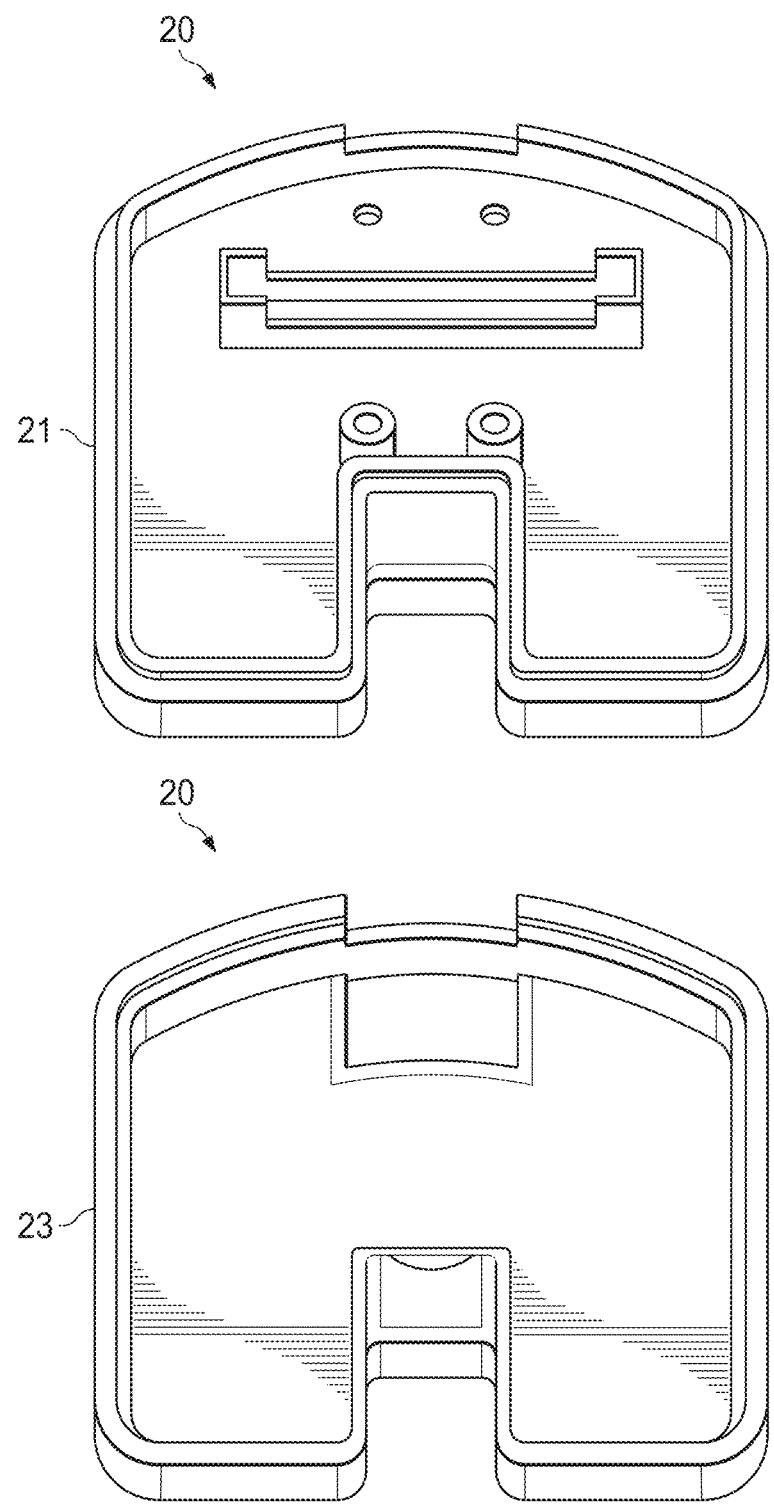
FIGS. 7A-B further illustrate aspects of an interior of an example housing of the sensing unit produced by additive manufacturing.
Figure 7B:
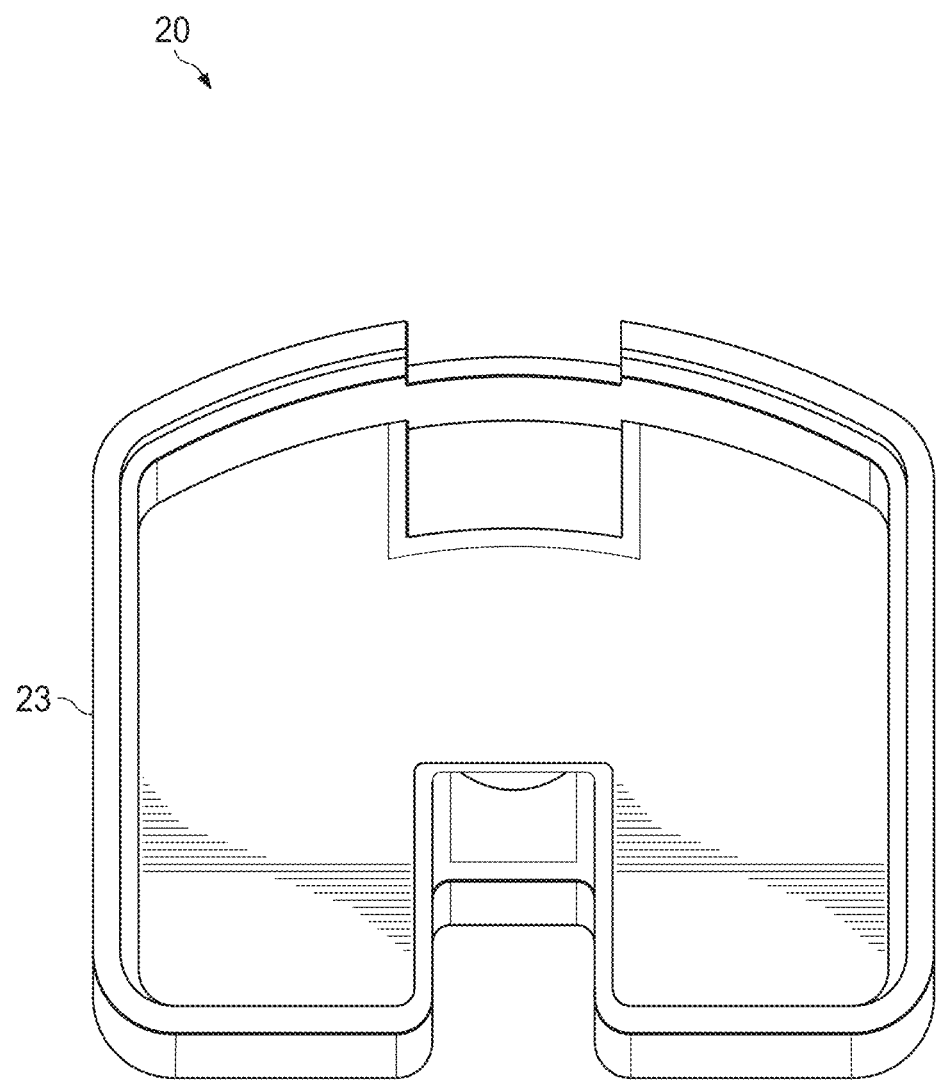
Figure 8:
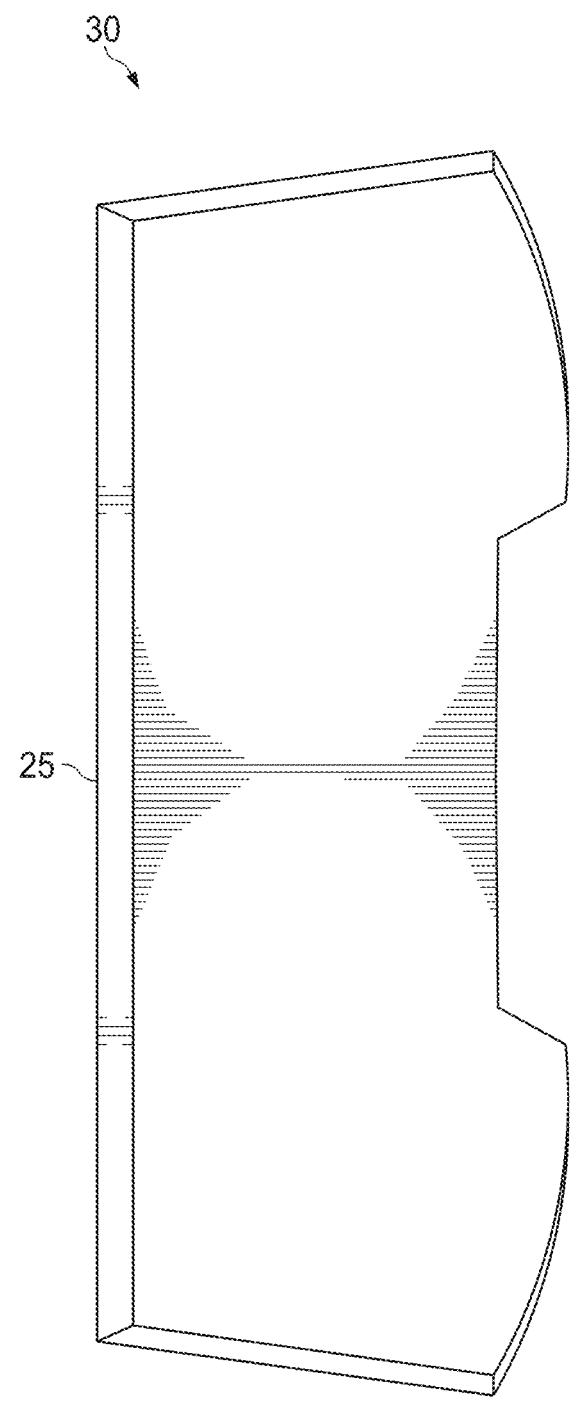
FIG. 8 depicts further aspects of the housing of the sensing unit.
Figure 9:
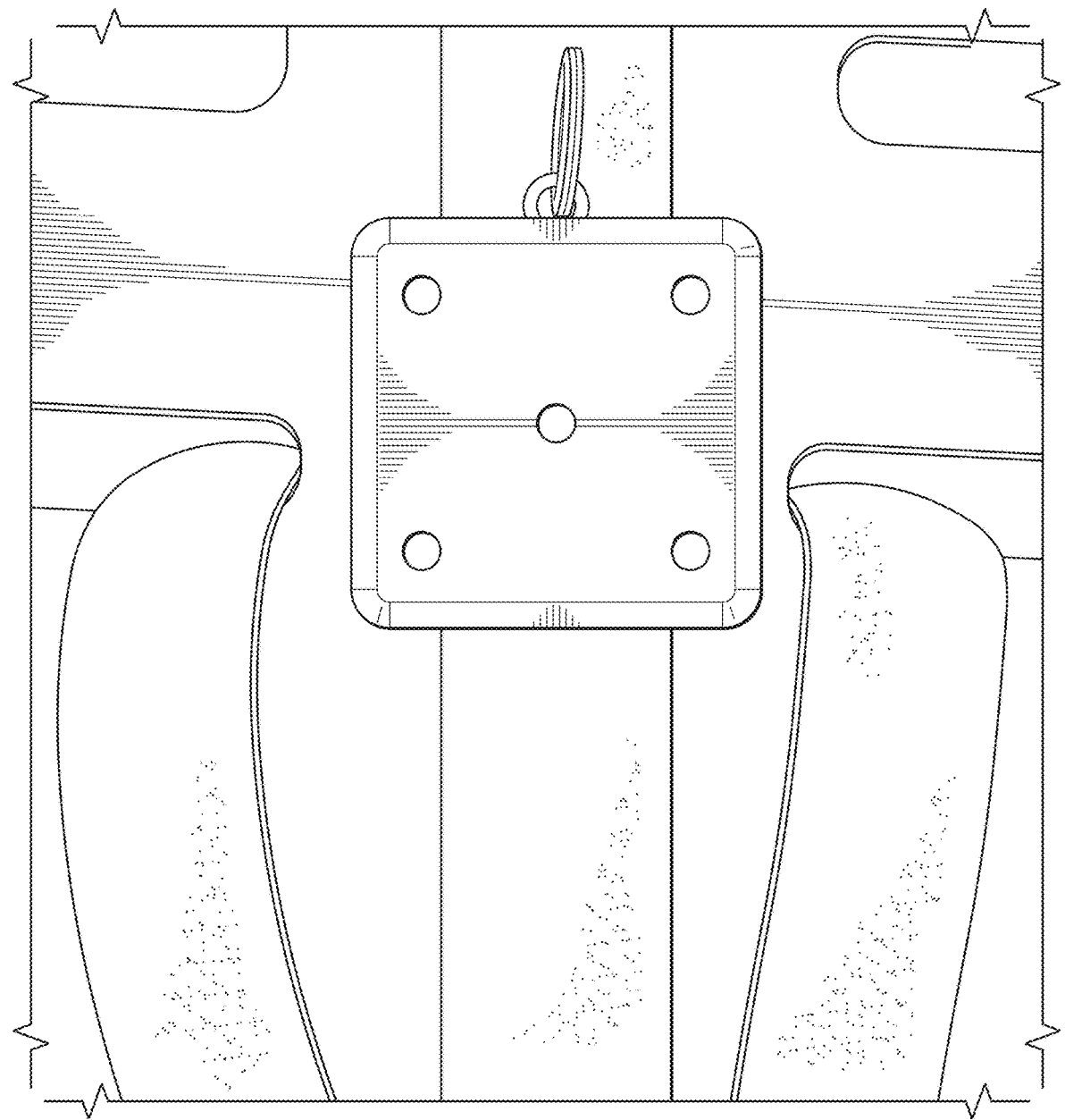
FIGS. 9-10 depict aspects of an example embodiment of the fob of the passenger safety system, in accordance with various embodiments.
Figure 10:
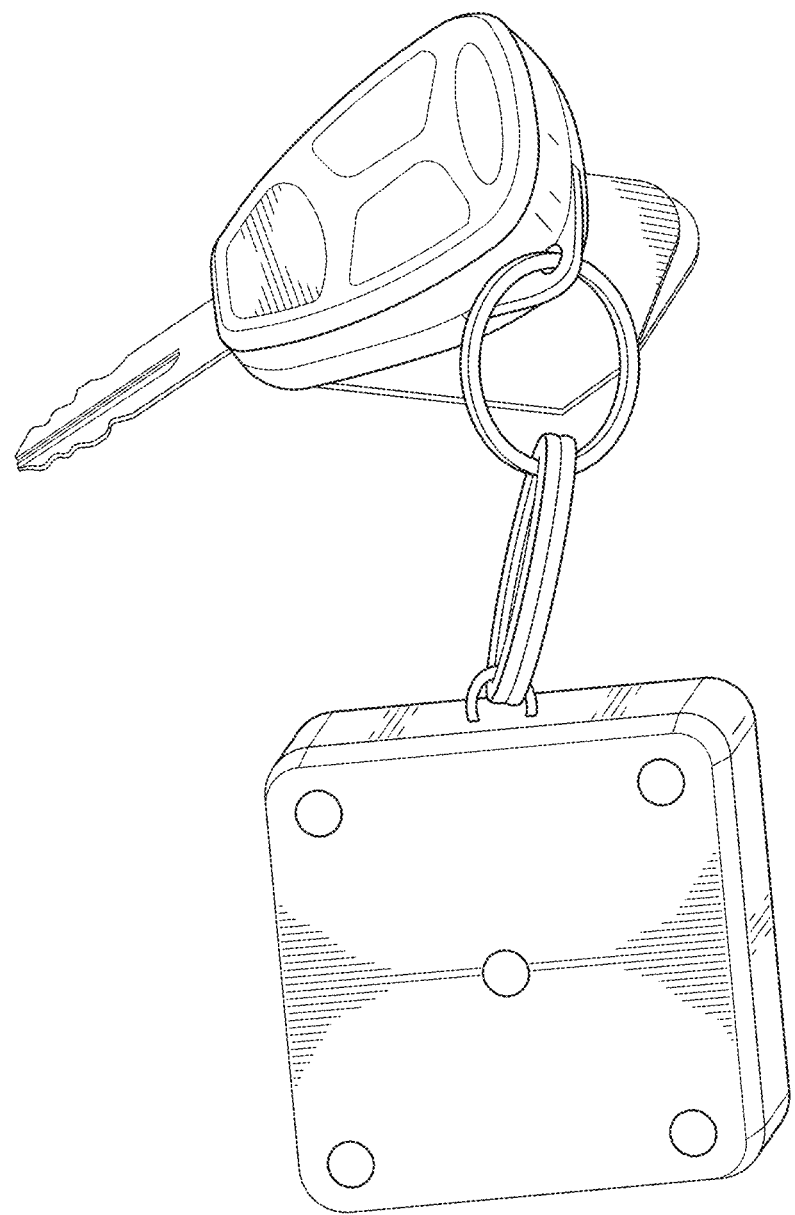
Figure 11:
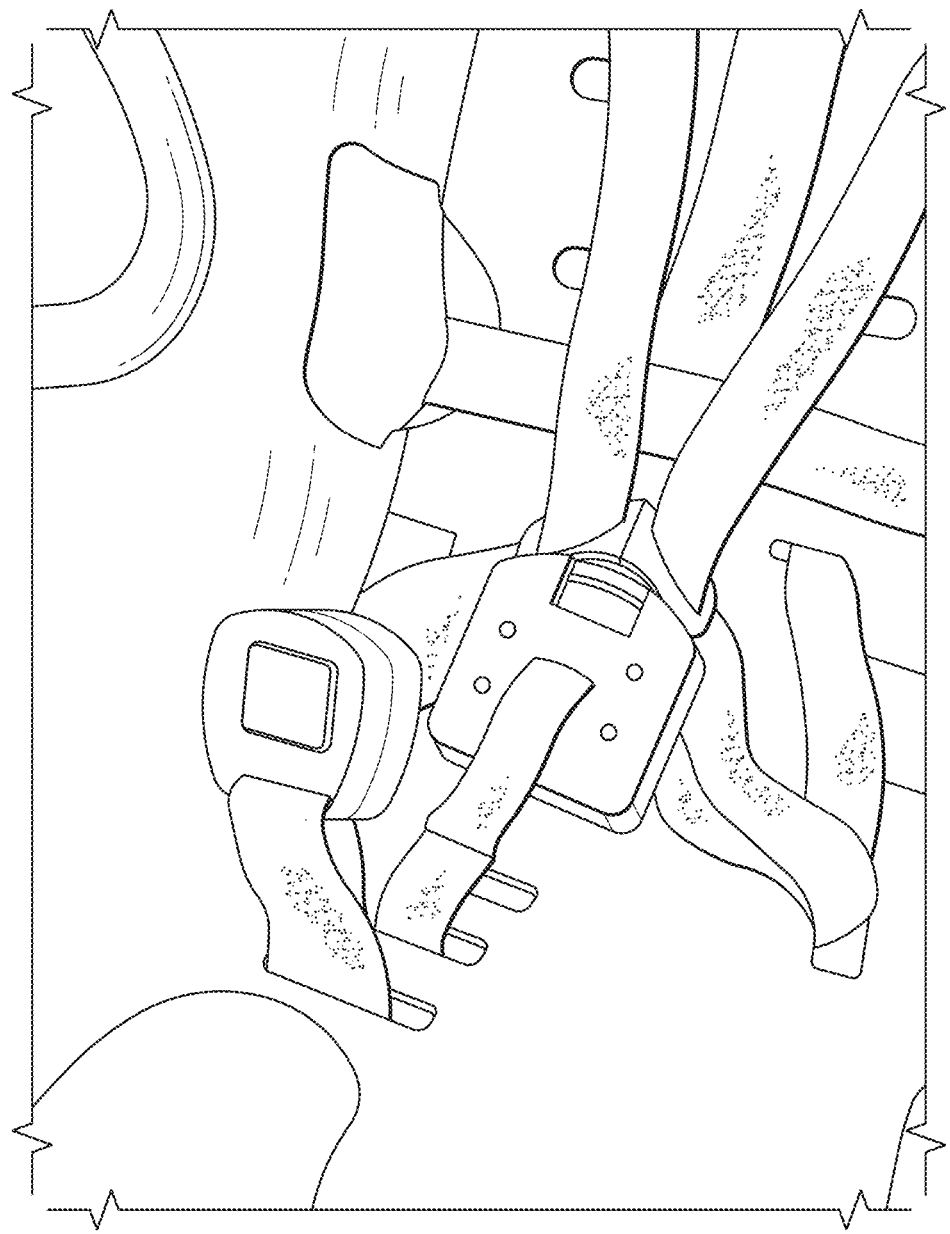
FIGS. 11-14 depict various views of a sensing unit in connection with a child safety seat, in accordance with various embodiments.
Figure 12:
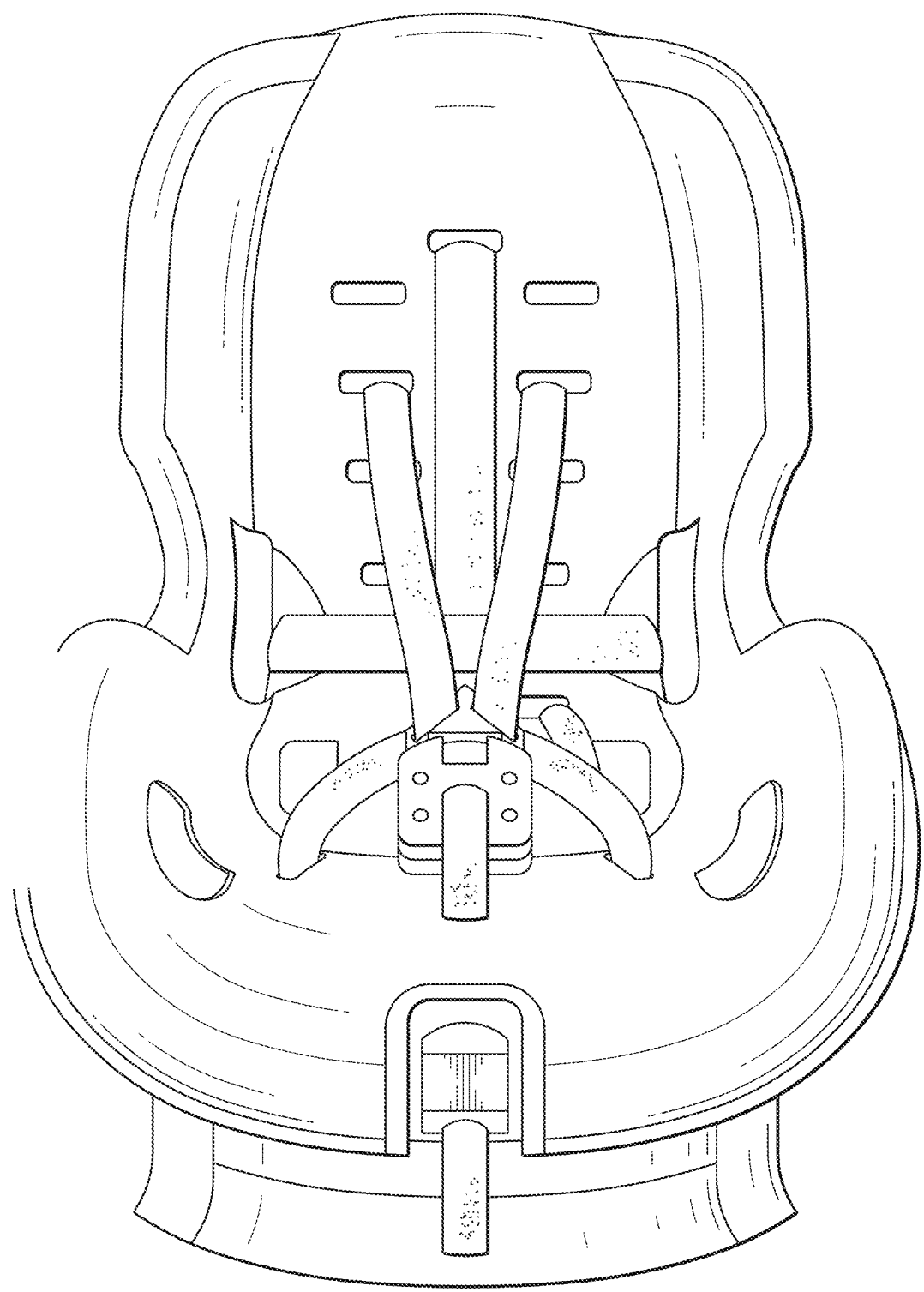
Figure 13:
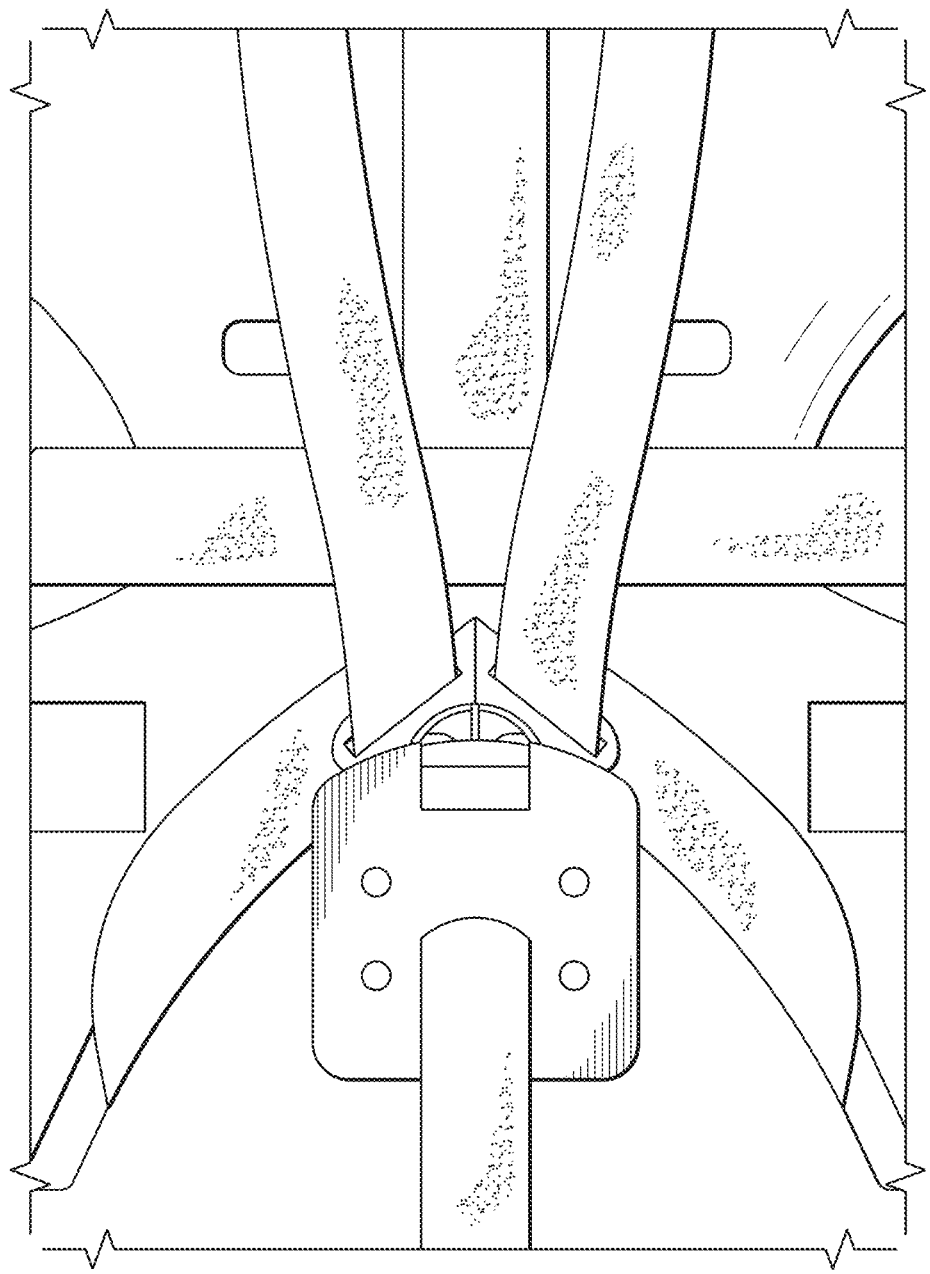
Figure 14:
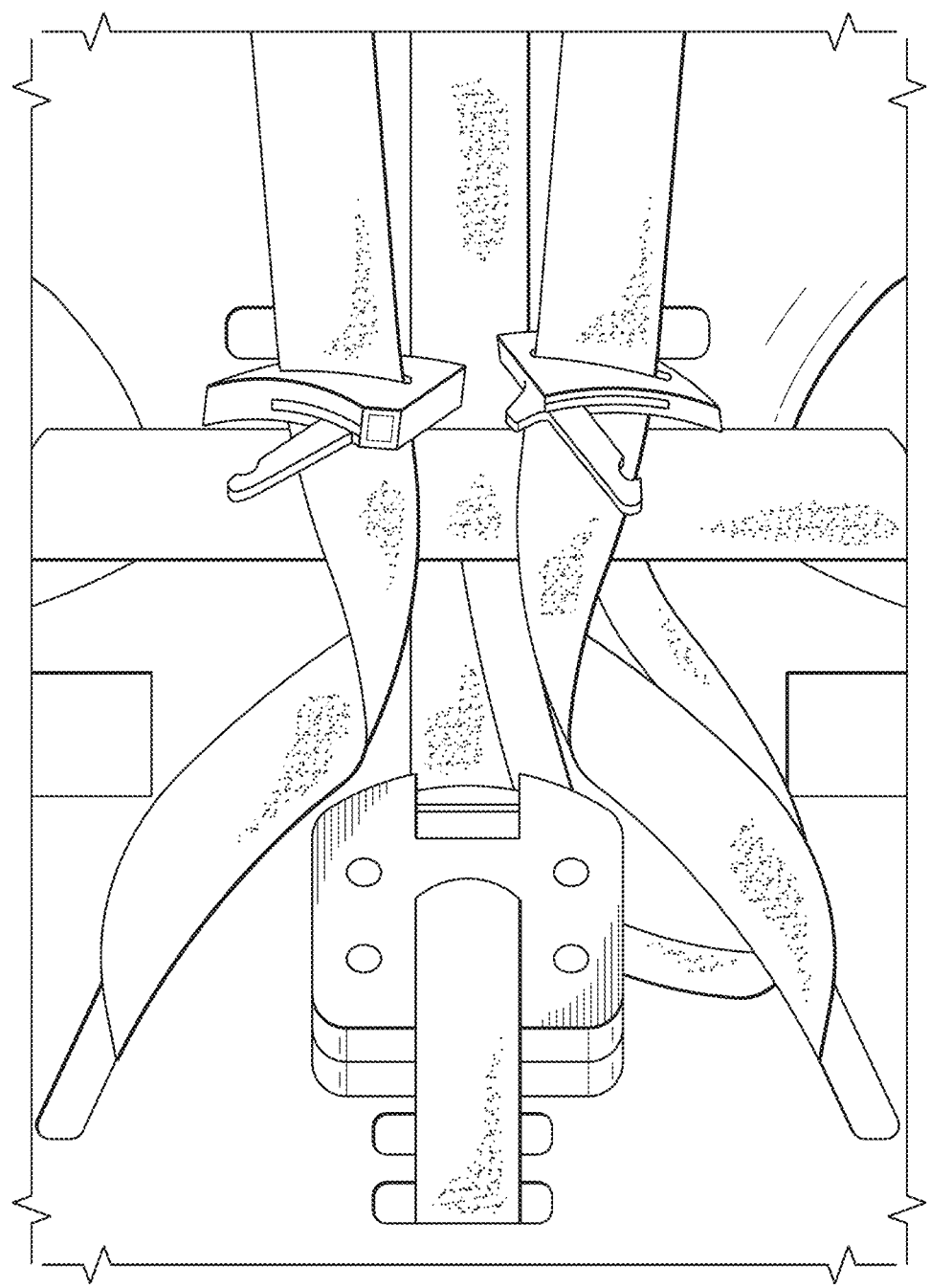

With reference to FIGS. 1A, 1B, and 3, various aspects of an example fob 4 are disclosed. A fob 4 may comprise a housing 12. A housing 12 may comprise a resilient enclosure configured to retain and protect electronics such as when placed in a user's pocket or otherwise as discussed herein. The fob 4 may also include a retention device 14. The retention device 14 may comprise a flange defining an aperture, or a chain, or any other mechanism whereby the retention device 14 may be coupled to a lanyard, keychain, grippably retained in hand, and/or the like.

Within the housing 12, various further aspects may be disclosed, which will be discussed further herein. For example, the fob 4 may comprise a fob transceiver 10 disposed within the housing 12. The fob transceiver 10 may be configured to electronically communicate with a sensing unit 8. For instance, the fob transceiver 10 may comprise a radio-frequency transceiver, or may comprise an optical transceiver, or may comprise a sonic, ultrasonic, or subsonic transceiver, or may comprise any further communication mechanism as desired. The fob transceiver 10 may interoperate with a fob controller 24 and an indicator array 26 to receive data from a sensing unit 8 representative of aspects of the sensing unit 8 and/or context environment 9 and display data representative of such aspects for a user. Moreover, the fob transceiver 10 may interoperate with the fob controller 24 to transmit and receive signals with the sensing unit 8 to determine whether the fob 4 and the sensing unit 8 are within a predetermined range from one another. For example, a fob transceiver 10 may be in operative communication with the sensing unit 8. Upon a loss of operative communication, the fob controller 24 may determine that the fob 4 is beyond the predetermined range and may instruct an indicator array 26 to provide a corresponding human readable indication. Furthermore, the fob controller 24 may interoperate with a transceiver power controller 22 to increase a power of a signal transmitted by the fob transceiver 10. In this manner, the fob transceiver 10 may regain operative communication with the sensing unit 8 and may transmit an indication that the fob has exceeded a predetermined range from the sensing unit 8 to the sensing unit 8 for the sensing unit to further use such as for a local indicator to display a similar corresponding indication that a predetermined range has been exceeded. In further instances, the transceiver power controller 22 is a portion of the sensing unit 8 and the sensing unit effectuates an increase in power following the loss of operative communication and transmits an instruction to the fob 4 to indicate the exceeding the predetermined range. In this manner, the power consumption and complexity of the fob 4 may be reduced.

The fob 4 may include a fob controller 24. The fob controller 24 may comprise a processor and a memory operative to process data and instructions in order to effectuate operative communication with eh sensing unit 8 and/or to effectuate display of human readable indications by an indicator array 26.

The fob 4 may include an indicator array 26. The indicator array 26 may comprise one or more human readable indicator. In various instances, the indicator array may include visual indicators, such as LEDs, or haptic indicators, such as tactile feedback generators, for instance vibrators, motors, moving indicators, or may include aural indicators, such as buzzers, speakers, piezoelectric indicators, and/or the like.

The indicator array 26 may comprise several indicators. For example, an indicator array 26 may conclude a first visual indicator 58-1, a second visual indicator 58-2, a third visual indicator 58-3, a fourth visual indicator 58-4, a fifth visual indicator 58-5 and any number N of visual indicators, such as a Nth visual indicator 58-n. In various instances, a first visual indicator 58-1 comprise a battery indicator 104 configured to provide an indicator of whether a battery of the fob 4 and/or sensing unit 8 is charged beyond a battery charge threshold, such as by changing color, illuminating, and/or the like. In various instances, a second visual indicator 58-2 comprise an attachment indicator 106 configured to provide an indicator of whether one or more sensor of a sensing unit 8 indicate that the sensing unit 8 is properly connected to a seat belt to retain an individual safely in a seat, such as by changing color, illuminating, and/or the like. In various instances, a third visual indicator 58-3 comprise a temperature indicator 108 configured to provide an indicator of whether a temperature of a context environment 9 proximate to a sensing unit 8 is within an acceptable range, such as by changing color, illuminating, and/or the like. In various instances, a fourth visual indicator 58-4 comprise a fob range indicator 110 configured to provide an indication of whether a fob 4 is within a distance less than a predetermined threshold from the sensing unit 8, such as by changing color, illuminating, and/or the like. In various instances, a fifth visual indicator 58-5 comprise an all clear 112 configured to provide an indicator of whether the sensing unit 8 is safely operable with temperature of a context environment 9 proximate to a sensing unit 8 within an acceptable range and distance of a fob 4 within less than a predetermined threshold from the sensing unit 8, and one or more sensor of the sensing unit 8 indicating the sensing unit 8 is properly connected to the seat belt to retain the individual safely in the seat, again, such as by changing color, illuminating, and/or the like.

Figure 1C:
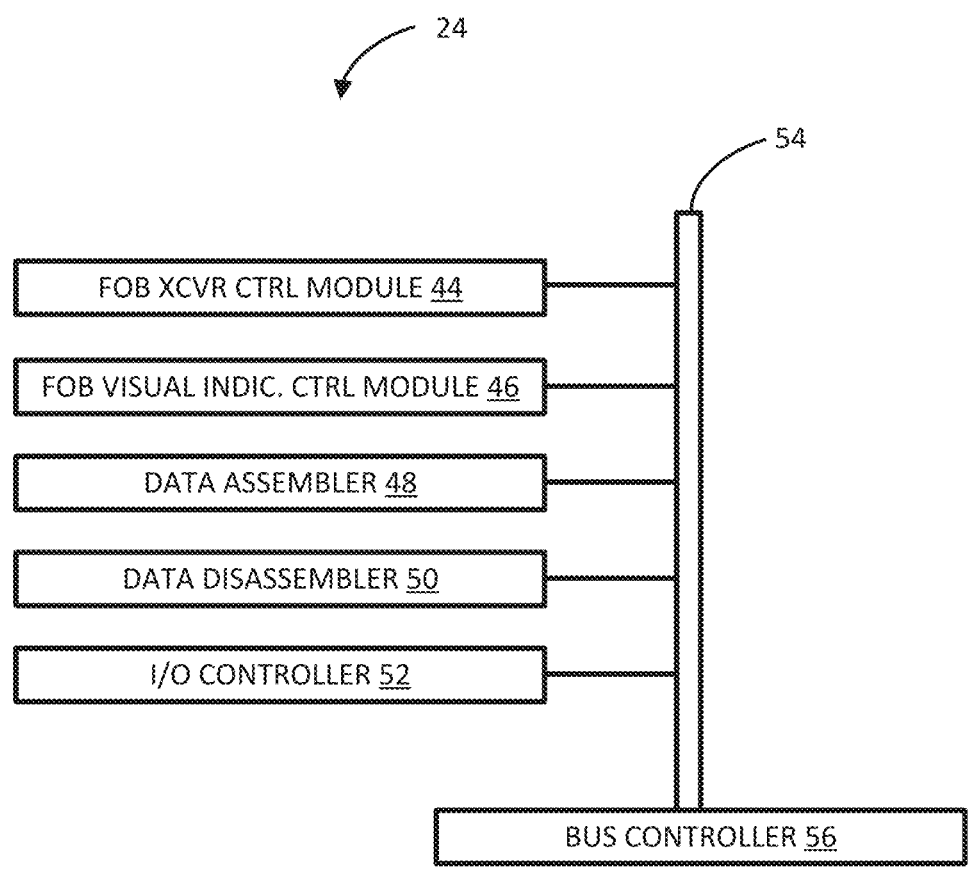
FIG. 1C illustrates aspects of a fob controller of the fob, in accordance with various embodiments.
Figure 1D:
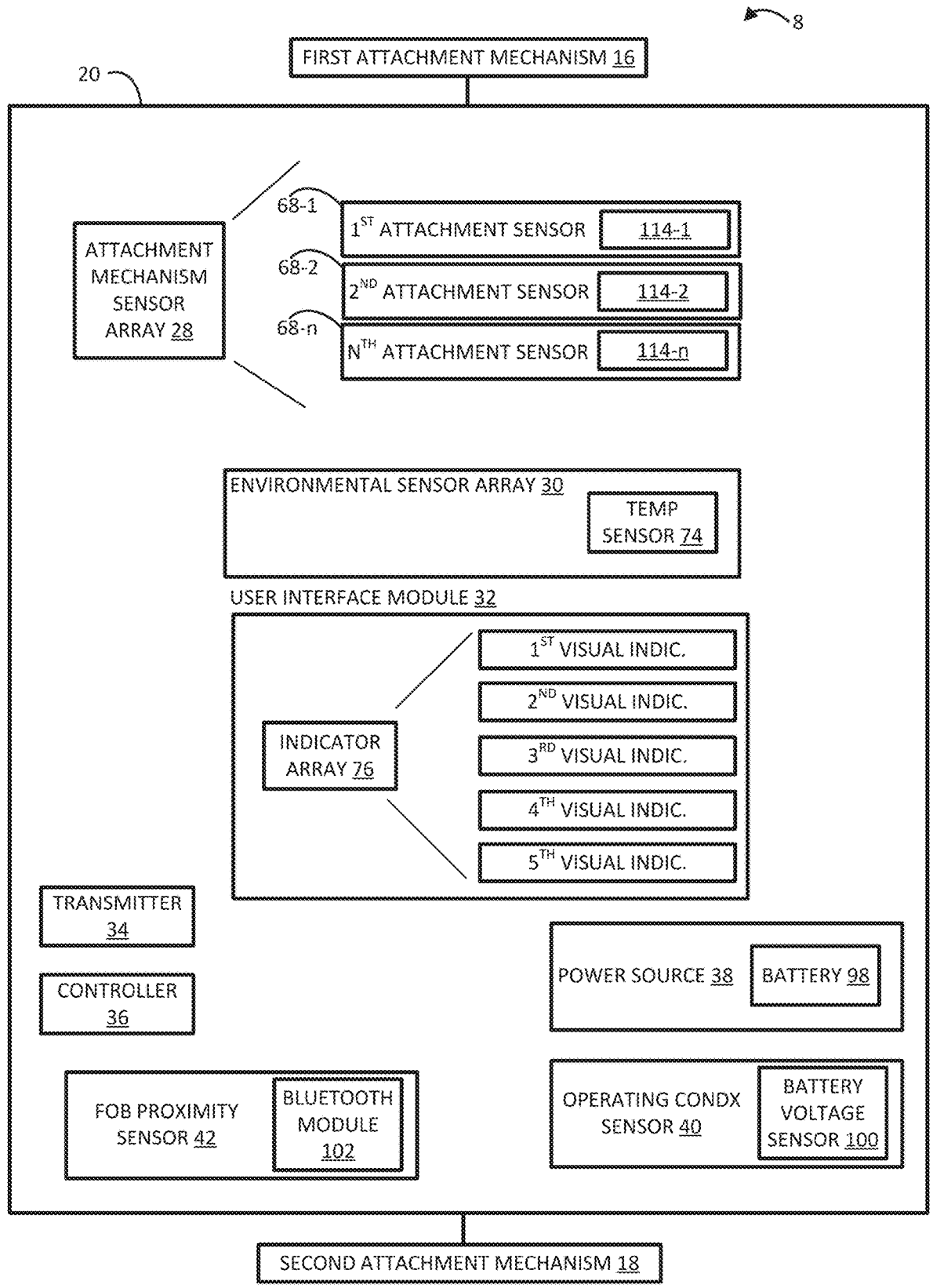
FIG. 1D illustrates aspects of a sensing unit of the passenger safety system, in accordance with various embodiments.

With reference now to FIG. 1C, the fob controller 24 is discussed in further detail. In various embodiments the fob controller comprises one or more modules operatively arranged to perform different functions. Each said module may be interconnected via a bus 54 and communication among the modules on the bus 54 directed by a bus controller 56. One may appreciate that while in various instances, the modules, bus 54 and/or bus controller 56 comprise different sub-circuits, in further instances one may appreciate that the modules, bus 54 and/or bus controller 56 may comprise logical modules and/or a logical bus 54 and/or logical bus controller 56 comprising logical aspects of the fob controller 24.

In various embodiments, the fob controller 24 comprises a fob transceiver control module 44. The fob transceiver control module 44 interoperates with other modules to direct the fob transceiver to transmit data from the bus 54, and/or distributes data received by the fob transceiver 10 onto the bus 54 for provision to aspects of the fob controller 24.

The fob controller 34 comprises a fob visual indication control module 46. The fob visual indication control module 46 operatively communicates with the indicator array 26 to provide human readable indications of data on the bus 54, such as provided by the fob controller 24.

The fob controller 24 comprises a data assembler 48. The data assembler 48 structures and arranges data according to the parameters of a targeted recipient. For instance, the data assembler 48 structures data for provision to the transceiver power controller 22 to instruct the transceiver power controller 22 to control the power of the transceiver and further structures data for provision to the fob transceiver 10 for transmission to a sensing unit 8.

The fob controller comprises a data disassembler 50. The data disassembler 50 disassembles structured data on the bus into constituent parts for delivery to various target modules. For instance, the fob transceiver 10 may receive structured data from the sensing unit 8 and the data disassembler 50 may divide that data into portions for the indicator array 26 and portions for the fob controller 24, and portions for the fob transceiver 10 and/or transceiver power controller 22.

Finally, the fob controller 24 may comprise an I/O controller 52. The I/O controller may be configured to interoperate with the fob transceiver 10 to serve as a clearing house for all data intended for transmission away from, or receipt into the fob 4. In this manner, data integrity may be maintained, such as by checking for malformed, malicious, and/or erroneous data. Moreover, the I/O controller 52 may comprise encryption provisions, such as to secure data for transmission.

Having discussed in detail, various aspects of the fob 4, attention is directed to the remote device 6. In various instances, a remote device 6 may include a smartphone having an application thereon configured to perform one or more aspect of the fob 4. In various instances, the remote device 6 is further operable to configure the fob 4 and or sensing unit 8, such as associating a particular fob 4 with a particular sensing unit 8, and/or setting the different threshold values associated with the activation of aspects of the indicator array 26.

Directing attention now to FIGS. 1A, 1D, 1E, 2, 4, 5, 6A-8, the sensing unit 8 of the passenger safety system 2 is now discussed in detail. In various embodiments, the sensing unit comprises an aspect of a car seat, such as an infant car seat, for example, a car seat buckle system. In further embodiments, the sensing unit 8 comprises an aspect of an adult seat buckle, for instance, an interstitial device insertable between conjugate slot and tab aspects of a seat belt latch, providing an attachment for each of the conjugate slot and tab aspects. The sensing unit may be configured to determine whether the conjugate slot and tab aspects are properly fastened, whether a battery has ample charge, whether a temperature is within an acceptable range, and/or whether a fob 4 is within less than a predetermined distance from the sensing unit 8.

In various embodiments, the sensing unit 8 comprises a first attachment mechanism 16 and a second attachment mechanism 18. In various embodiments, wherein the sensing unit 8 is a part of a child car seat, the first attachment mechanism 16 comprises a first child retention strap such as a first shoulder strap and the second attachment mechanism 18 comprises a second child retention strap such as a second shoulder strap. In further embodiments, wherein the sensing unit 8 is a device interstitially installable between conjugate fastening features of an adult safety belt, the first attachment mechanism 16 may be configured to connect to a first of the conjugate fastening features, for example, a seat belt tab, and the second attachment mechanism 18 may be configured to connect to a second of the conjugate fastening features, for example, a seat belt tab receptacle and selective release.

The sensing unit 8 may comprise a housing 20. A housing 20 may comprise a structural unit configure to provide durability and resiliency to the sensing unit 8 and in various instances, to provide support and environmental protection to electronics disposed therein. For example, a housing 20 may comprise a first partial shell 21, a second partial shell 23, and a release button 25. The first partial shell 21 and the second partial shell 23 may be joined together such as by screws, gluing, ultrasonic welding, and or the like, to complete a generally enclosed structure with an interior void for receiving electronics. In various instances, the electronics are installed prior to the joining together of the first partial shell 21 and second partial shell 23. Moreover, the housing 20 may comprise a release button 25. The release button 25 may operate the first attachment mechanism 16 and/or the second attachment mechanism 18 to release all or part of a seat belt from a passenger safety system 2.

Further aspects of the sensing unit 8 are associated with the housing 20. For example, the housing may comprise an attachment mechanism sensor array 28. The attachment mechanism sensor array 28 may comprise one or more sensor configured to determine whether at least one of a first attachment mechanism 16 and/or a second attachment mechanism 18 is secured. For example, an attachment mechanism sensor array 28 may include optical sensors to detect shadow or occlusion of light beam(s), may include electromagnetic sensors, such as Hall Effect sensors to detect the proximity of materials with certain electromagnetic properties, may include capacitive or inductive sensors, such as to detect a change in capacitance and/or inductances, and/or may include a transponder sensor, such as to detect the proximity of an RFID or other transponder-type sensor component.

The attachment mechanism sensor array 28 may include, for example, a first attachment sensor 68-1, a second attachment sensor 68-2, and/or any number N of attachment sensors, such as an Nth attachment sensor 68-n. Each such attachment sensor may be associated with an attachment mechanism. For instances, a first attachment sensor 68-1 may be associated with a first attachment mechanism 16 and a second attachment sensor 68-2 may be associated with a second attachment mechanism 18. In various embodiments, the first attachment sensor 68-1 comprises a first Hall Effect sensor 114-1, the second attachment sensor 68-2 comprises a second Hall Effect sensor 114-2, and the Nth attachment sensor 68-n comprises a Nth Hall Effect sensor 114-n, though any further combination of sensors may be provided.

In various embodiments, the housing includes an environmental sensor array 30. The environmental sensor array 30 may comprise one or more sensor configured to sense aspects of a context environment 9. For example, an environmental sensor array 30 may include a temperature sensor 74. The temperature sensor 74 may detect a temperature present in the context environment 9. In further instances, pressure sensors, humidity/moisture sensors, altimeters, velocity sensors, accelerometers, and/or other sensors may be provided within the environmental sensor array 30 as desired.

In various embodiments, the housing includes an operating conditions sensor 40. For instance, the housing may include a power source 38, such as one or more battery 98 to power the sensing unit 8. In further instances, the power source 38 includes an external power source. Thus, there may be an operating conditions sensor 40 to evaluate various operative conditions of the sensing unit 8, such as the performance of the power source 38. In various instances, the operating conditions sensor 40 comprises a battery voltage sensor 100 configured to monitor a voltage of the battery 98 and provide an indication to a sensing unit controller 36 corresponding to the battery voltage and/or corresponding to an indication that the battery voltage falls below a threshold.

In various embodiments, the housing includes a fob proximity sensor 42. While in various instances, discussion has been directed herein to various transceivers and adjustment of the transmission of various transceivers as well as a detection of a loss of signal in order to determine when a fob 4 and/or remote device 6 is outside predetermined distance from the sensing unit 8, in further embodiments, a separate sensor is implemented to make such a detection. Moreover, in further embodiments, a similar power adjustment mechanism, as well as a similar detection of a loss of signal is implemented with the fob proximity sensor 42 rather than with the transceivers mentioned elsewhere herein. For example, in various embodiments a fob proximity sensor 42 is provided. A fob proximity sensor 42 comprises any sensor whereby the physical proximity of a fob 4 and/or remote device 8 may be ascertained with respect to the sensing device 8. For example, a fob proximity sensor 42 may comprise a Bluetooth fob transceiver 102 operative according to a power adjustment mechanism and/or loss of signal detection scheme consistent with that discussed elsewhere herein.

The housing 20 may also include a user-interface module 32. A user-interface module 32 may include any human-interpretable aspect configured to communication information from the passenger safety system 2 to a human via an indication emanating from the housing 20. For example, the user-interface module 32 may comprise an electronic device in operative communication with other aspects discussed herein and structured to display information to a user, such as by indicator lights, a LCD or other screen device, aural annunciation, alarms, and/or the like. In various instance, the user-interface module 32 includes a sensing unit indicator array 76.

The sensing unit indicator array 76 may comprise one or more human readable indicator. In various instances, the indicator array may include visual indicators, such as LEDs, or haptic indicators, such as tactile feedback generators, for instance vibrators, motors, moving indicators, or may include aural indicators, such as buzzers, speakers, piezoelectric indicators, and/or the like.

The sensing unit indicator array 76 may comprise several indicators. For example, a sensing unit indicator array 76 may conclude a first sensing unit visual indicator 116-1, a second sensing unit visual indicator 116-2, a third sensing unit visual indicator 116-3, a fourth sensing unit visual indicator 116-4, a fifth sensing unit visual indicator 116-5 and any number N of visual indicators, such as a Nth sensing unit visual indicator 116-*n*. In various instances, a first sensing unit visual indicator 116-1 comprise a sensing unit battery indicator 118 configured to provide an indicator of whether a battery of the fob 4 and/or sensing unit 8 is charged beyond a battery charge threshold, such as by changing color, illuminating, and/or the like. In various instances, a second sensing unit visual indicator 116-2 comprise a sensing unit attachment indicator 120 configured to provide an indicator of whether one or more sensor of a sensing unit 8 indicate that the sensing unit 8 is properly connected to a seat belt (for instance, via the first attachment mechanism 16 and/or second attachment mechanism 18) to retain an individual safely in a seat, such as by changing color, illuminating, and/or the like. In various instances, a third sensing unit visual indicator 116-3 comprises a sensing unit temperature indicator 122 configured to provide an indicator of whether a temperature of a context environment 9 proximate to a sensing unit 8 is within an acceptable range, such as by changing color, illuminating, and/or the like. In various instances, a fourth sensing unit visual indicator 116-4 comprises a sensing unit fob range indicator 124 configured to provide an indication of whether a fob 4 is within a distance less than a predetermined threshold from the sensing unit 8, such as by changing color, illuminating, and/or the like. In various instances, a fifth sensing unit visual indicator 116-5 comprises a sensing unit all clear 126 configured to provide an indicator of whether the sensing unit 8 is safely operable with temperature of a context environment 9 proximate to a sensing unit 8 within an acceptable range and distance of a fob 4 within less than a predetermined threshold from the sensing unit 8, and one or more sensor of the sensing unit 8 indicating the sensing unit 8 is properly connected to the seat belt to retain the individual safely in the seat, again, such as by changing color, illuminating, and/or the like.

The sensing unit housing 20 of the sensing unit 8 may also comprise a sensing unit transceiver 34 within the sensing unit housing 20. The sensing unit transceiver 34 may be configured to electronically communicate with a fob 4 and/or a remote device 6. For instance, the sensing unit transceiver 34 may comprise a radio-frequency transceiver, or may comprise an optical transceiver, or may comprise a sonic, ultrasonic, or subsonic transceiver, or may comprise any further communication mechanism as desired. The sensing unit transceiver 34 may interoperate with a sensing unit controller 36 and the user interface module 32, as well as the environmental sensor array 30 and attachment mechanism sensor array 29, operating conditions sensor 40 and fob proximity sensor 42 to send data to a fob 4 and/or remote device 6 representative of aspects of the sensing unit 8 and/or context environment 9 and display data representative of such aspects for a user. Moreover, the sensing unit transceiver 34 may interoperate the sensing unit controller 36 to transmit and receive signals with the fob 4 to determine whether the fob 4 and the sensing unit 8 are within a predetermined range from one another. For example, a sensing unit transceiver 34 may be in operative communication with the fob 4 and/or remote device 6. Upon a loss of operative communication, the sensing unit controller 36 may determine that the fob 4 and/or remote device 6 is beyond the predetermined range and may instruct the sensing unit user-interface module 32 (for instance, a sensing unit indicator array 76) to provide a corresponding human readable indication. Furthermore, the sensing unit controller 36 may interoperate with a power controller to increase a power of a signal transmitted by the sensing unit transceiver 34. In this manner, the sensing unit transceiver 34 may regain operative communication with the fob 4 and/or remote device 6 and may transmit an indication that the fob 4 and/or remote device 6 has exceeded a predetermined range from the sensing unit 8 to the fob 4 and/or remote device 6 for the fob 4 and/or remote device 6 to further use such as for a local indicator to display a similar corresponding indication that a predetermined range has been exceeded.

The sensing unit 8 may include a sensing unit controller 36, as described. The sensing unit controller 36 may comprise a processor and a memory operative to process data and instructions in order to effectuate operative communication with the fob 4 and/or remote device 6 and/or to effectuate display of human readable indications by a user interface module 32 (for instance, a sensing unit indicator array 76).

Figure 1E:
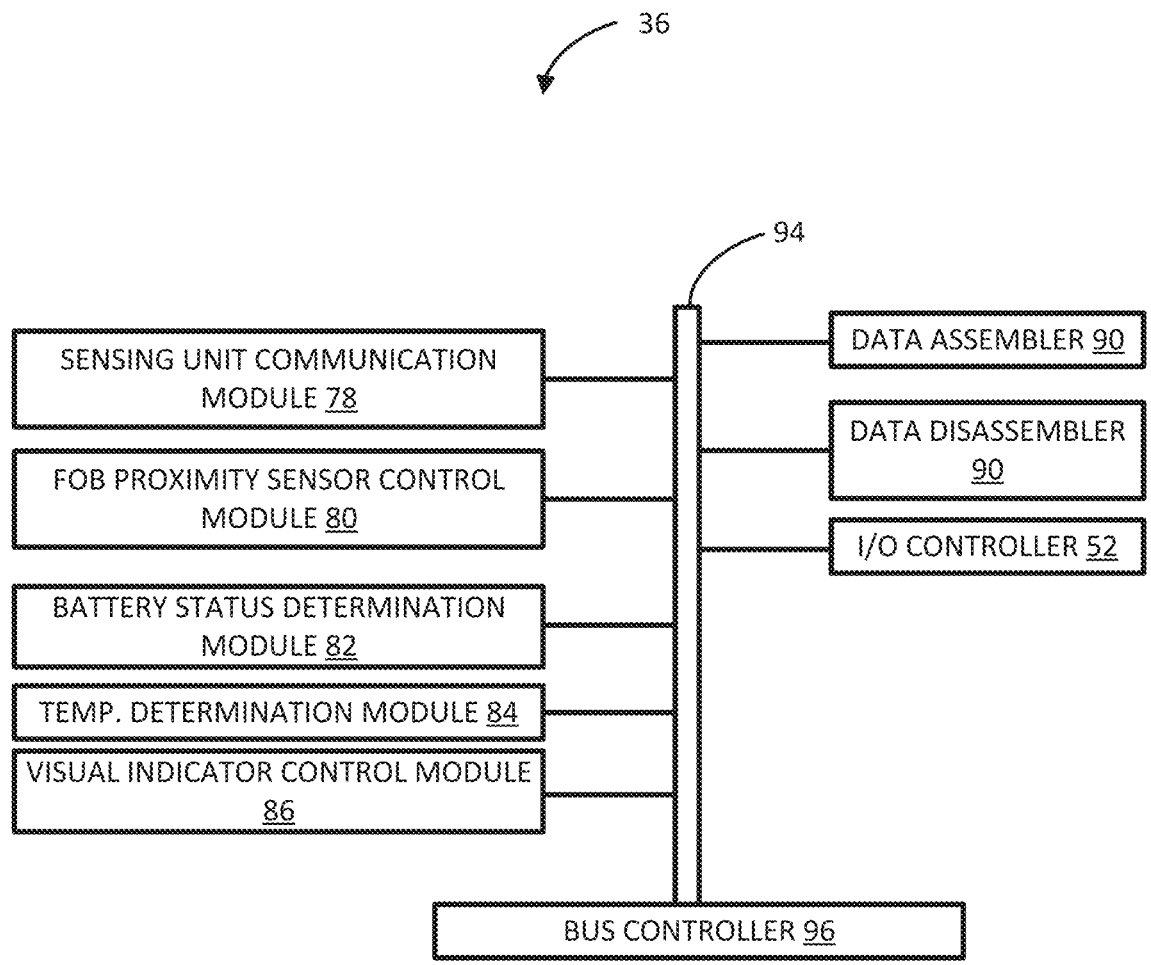
FIG. 1E illustrates aspects of a sensing unit controller of the sensing unit, in accordance with various embodiments.
Figure 2:
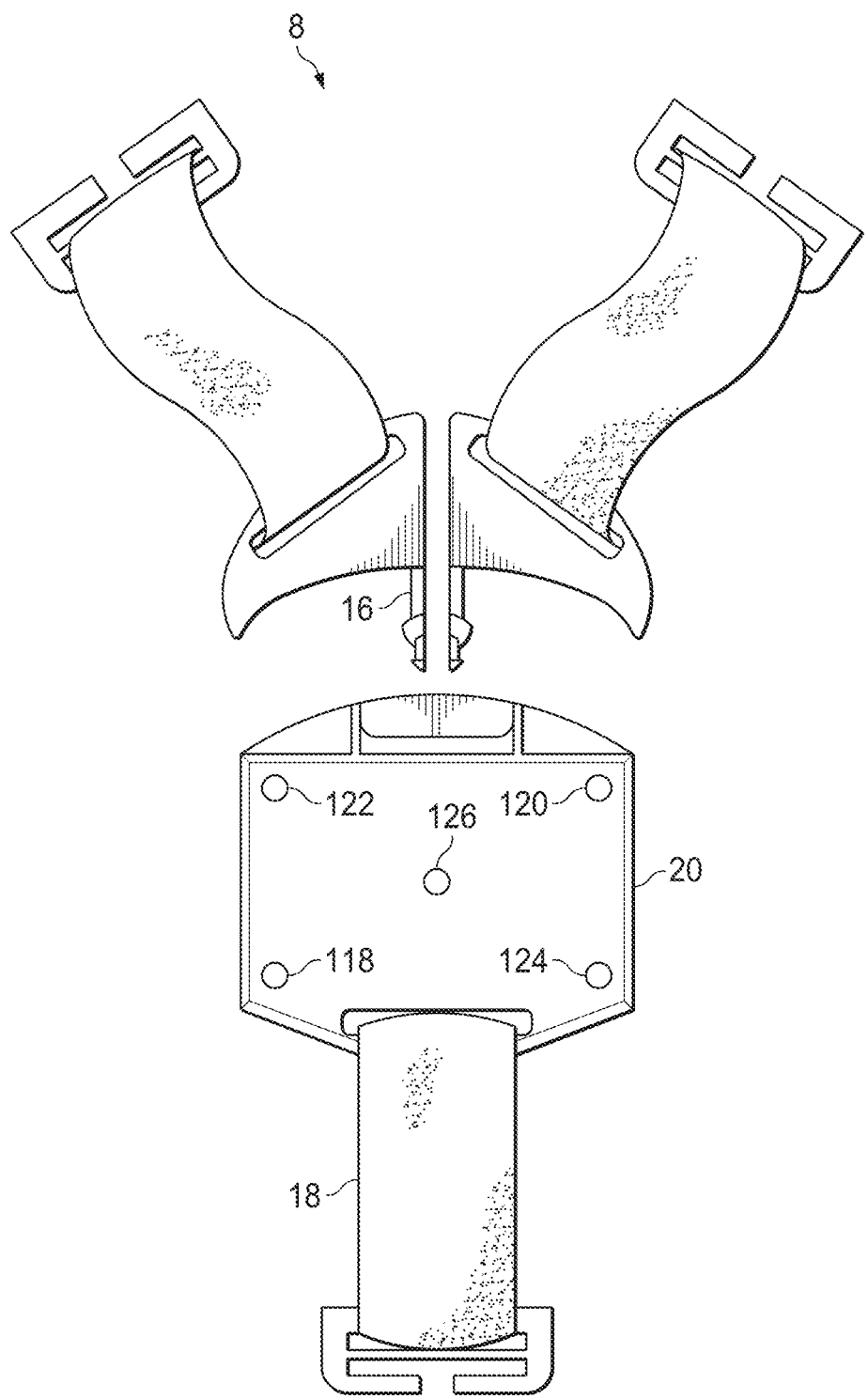
FIG. 2 illustrates one example embodiment of the sensing unit of the passenger safety system in connection with implementation in a car seat.

With reference now to FIG. 1E, the sensing unit controller 36 is discussed in further detail. In various embodiments the sensing unit controller 36 comprises one or more modules operatively arranged to perform different functions. Each said module may be interconnected via a sensing unit controller bus 94 and communication among the modules on the sensing unit controller bus 94 directed by a sensing unit bus controller 96. One may appreciate that while in various instances, the modules, sensing unit controller bus 94 and/or sensing unit bus controller 96 comprise different sub-circuits, in further instances one may appreciate that the modules, sensing unit controller bus 94 and/or sensing unit bus controller 96 may comprise logical modules and/or a logical sensing unit controller bus 94 and/or logical sensing unit bus controller 96 comprising logical aspects of the sensing unit controller 36.

In various embodiments, the sensing unit controller 36 comprises a sensing unit communication module 78. The sensing unit communication module 78 interoperates with other modules to direct the transmitting and sending of data from and to the sensing unit controller bus 94, and/or distribution of data received by the sensing unit transceiver 34 onto the sensing unit controller bus 94 for provision to aspects of the sensing unit controller 36.

The sensing unit controller 36 comprises a sensing unit visual indication control module 86. The sensing unit visual indication control module 86 operatively communicates with the user-interface module 32 (such as the indicator array 76) to provide human readable indications of data on the sensing unit controller bus 94, such as provided by the sensing unit controller 36.

The sensing unit controller 36 comprises a sensing unit data assembler 88. The sensing unit data assembler 88 structures and arranges data according to the parameters of a targeted recipient. For instance, the sensing unit data assembler 88 structures data for provision to the fob proximity sensor 42 to instruct the fob proximity sensor 42 to control the power of radio transmissions from the Bluetooth fob transceiver 102 and further structures data for provision to the sensing unit transceiver 34 for transmission to a fob 4.

The sensing unit controller 36 comprises a sensing unit data disassembler 90. The sensing unit data disassembler 90 disassembles structured data on the sensing unit bus 94 into constituent parts for delivery to various target modules. For instance, the sensing unit transceiver 34 may receive structured data from the fob 4 and the sensing unit data disassembler 90 may divide that data into portions for the sensing unit indicator array 76 of the user-interface module 32 and portions for the sensing unit controller 36, and portions for the fob proximity sensor 42 and/or the like.

Furthermore, the sensing unit controller 36 may comprise a sensing unit I/O controller 92. The sensing unit I/O controller 92 may be configured to interoperate with the sensing unit transceiver 34 to serve as a clearing house for all data intended for transmission away from, or receipt into the sensing unit 8. In this manner, data integrity may be maintained, such as by checking for malformed, malicious, and/or erroneous data. Moreover, the sensing unit I/O controller 92 may comprise encryption provisions, such as to secure data for transmission.

The sensing unit controller 36 may also have modules specific to various sensors. For example, the sensing unit controller 36 may have a fob proximity sensor control module 80 configured to provide instructions to, and receive responses from the fob proximity sensor 42, such as with respect to a power level setting. Moreover, the sensing unit controller 36 may have a battery status determination module 82, such as to interoperate with the operating conditions sensor 40 to query the operating conditions sensor 40 and/or catch interrupts from the operating conditions sensor 40 representative of a battery voltage and instruct the operation of other modules and aspects of the sensing unit 8 in response thereto, for instance, entry into a low power mode. Furthermore, the sensing unit controller 36 may have a temperature determination module 84 which may interoperate with an environmental sensor array 30, for instance a temperature sensor 74, to interpret data and/or signals provided thereby and ascertain a temperature of a context environment 9.

Finally, and with reference to FIGS. 1-14, but particularly with reference to FIGS. 9-14, various exemplary embodiments of both an example sensing unit and an example fob are shown in connection with a child safety seat and a key chain, respectively.

As used herein, the term "network," such as with respect to a network which may comprise at least a portion of fob control channel 3 and/or remote device communication channel 9 provided in FIG. 1A, includes any cloud, cloud computing system or electronic communications system or method which incorporates hardware and/or software components. Communication among the parties may be accomplished through any suitable communication channels, such as, for example, a telephone network, an extranet, an intranet, Internet, point of interaction device (point of sale device, personal digital assistant (e.g., iPhone®, Palm Pilot®, Blackberry®), cellular phone, kiosk, etc.), online communications, satellite communications, off-line communications, wireless communications, transponder communications, local area network (LAN), wide area network (WAN), virtual private network (VPN), networked or linked devices, keyboard, mouse and/or any suitable communication or data input modality. Moreover, although the system is frequently described herein as being implemented with TCP/IP communications protocols, the system may also be implemented using IPX, Appletalk, IP-6, NetBIOS, OSI, any tunneling protocol (e.g. IPsec, SSH), or any number of existing or future protocols. If the network is in the nature of a public network, such as the Internet, it may be advantageous to presume the network to be insecure and open to eavesdroppers. Specific information related to the protocols, standards, and application software utilized in connection with the Internet is generally known to those skilled in the art and, as such, need not be detailed herein. See, for example, DILIP NAIK, INTERNET STANDARDS AND PROTOCOLS (1998); JAVA 2 COMPLETE, various authors, (Sybex 1999); DEBORAH RAY AND ERIC RAY, MASTERING HTML 4.0 (1997); and LOSHIN, TCP/IP CLEARLY EXPLAINED (1997) and DAVID GOURLEY AND BRIAN TOTTY, HTTP, THE DEFINITIVE GUIDE (2002), the contents of which are hereby incorporated by reference.

A network may be unsecure. Thus, communication over the network may utilize data encryption. Encryption may be performed by way of any of the techniques now available in the art or which may become available—e.g., Twofish, RSA, El Gamal, Schorr signature, DSA, PGP, PKI, GPG (GnuPG), and symmetric and asymmetric cryptosystems.

Any communication, transmission and/or channel discussed herein may include any system or method for delivering content (e.g. data, information, metadata, etc.), and/or the content itself. The content may be presented in any form or medium, and in various embodiments, the content may be delivered electronically and/or capable of being presented electronically. For example, a channel may comprise a website or device (e.g., Facebook, YouTube®, AppleTV®, Pandora®, xBox®, Sony® Playstation®), a uniform resource locator ("URL"), a document (e.g., a Microsoft Word® document, a Microsoft Excel® document, an Adobe .pdf document, etc.), an "ebook," an "emagazine," an application or microapplication (as described herein), an SMS or other type of text message, an email, Facebook, twitter, MMS and/or other type of communication technology. In various embodiments, a channel may be hosted or provided by a data partner. In various embodiments, the distribution channel may comprise at least one of a merchant website, a social media website, affiliate or partner websites, an external vendor, a mobile device communication, social media network and/or location based service. Distribution channels may include at least one of a merchant website, a social media site, affiliate or partner websites, an external vendor, and a mobile device communication. Examples of social media sites include Facebook®, Foursquare®, Twitter®, MySpace®, LinkedIn®, and the like. Examples of affiliate or partner websites include American Express®, Visa®, Google®, and the like. Moreover, examples of mobile device communications include texting, email, and mobile applications for smartphones.

In various embodiments, the methods described herein are implemented using the various particular machines described herein. The methods described herein may be implemented using the below particular machines, and those hereinafter developed, in any suitable combination, as would be appreciated immediately by one skilled in the art. Further, as is unambiguous from this disclosure, the methods described herein may result in various transformations of certain articles.

For the sake of brevity, conventional data networking, application development and other functional aspects of the systems (and components of the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical system.

The various system components discussed herein may include one or more of the following: a host server or other computing systems including a processor for processing digital data; a memory coupled to the processor for storing digital data; an input digitizer coupled to the processor for inputting digital data; an application program stored in the memory and accessible by the processor for directing processing of digital data by the processor; a display device coupled to the processor and memory for displaying information derived from digital data processed by the processor; and a plurality of databases. Various databases used herein may include: client data; merchant data; utility company data; institution data; regulatory agency data; and/or like data useful in the operation of the system. As those skilled in the art will appreciate, user computer may include an operating system (e.g., Windows NT®, Windows 95/98/2000®, Windows XP®, Windows Vista®, Windows 7®, OS2, UNIX®, Linux®, Solaris®, MacOS, etc.) as well as various conventional support software and drivers typically associated with computers.

The present system or any part(s) or function(s) thereof may be implemented using hardware, software or a combination thereof and may be implemented in one or more computer systems or other processing systems. However, the manipulations performed by embodiments were often referred to in terms, such as determining or selecting, which are commonly associated with mental operations performed by a human operator. No such capability of a human operator is necessary, possible, or desirable in most cases, in any of the operations described herein. Rather, the operations may be machine operations not performable by mere human activity.

In fact, in various embodiments, the embodiments are directed toward one or more computer systems capable of carrying out the functionality described herein. The computer system includes one or more processors, such as processor. The processor is connected to a communication infrastructure (e.g., a communications bus, cross over bar, or network). Various software embodiments are described in terms of this exemplary computer system. After reading this description, it will become apparent to a person skilled in the relevant art(s) how to implement various embodiments using other computer systems and/or architectures. Computer system can include a display interface that forwards graphics, text, and other data from the communication infrastructure (or from a frame buffer not shown) for display on a display unit.

Computer system also includes a main memory, such as for example random access memory (RAM), and may also include a secondary memory. The secondary memory may include, for example, a hard disk drive and/or a removable storage drive, representing a floppy disk drive, a magnetic tape drive, an optical disk drive, etc. The removable storage drive reads from and/or writes to a removable storage unit in a well-known manner. Removable storage unit represents a floppy disk, magnetic tape, optical disk, etc. which is read by and written to by removable storage drive. As will be appreciated, the removable storage unit includes a computer usable storage medium having stored therein computer software and/or data.

In various embodiments, secondary memory may include other similar devices for allowing computer programs or other instructions to be loaded into computer system. Such devices may include, for example, a removable storage unit and an interface. Examples of such may include a program cartridge and cartridge interface (such as that found in video game devices), a removable memory chip (such as an erasable programmable read only memory (EPROM), or programmable read only memory (PROM)) and associated socket, and other removable storage units and interfaces, which allow software and data to be transferred from the removable storage unit to computer system.

Computer system may also include a communications interface. Communications interface allows software and data to be transferred between computer system and external devices. Examples of communications interface may include a modem, a network interface (such as an Ethernet card), a communications port, a Personal Computer Memory Card International Association (PCMCIA) slot and card, etc. Software and data transferred via communications interface are in the form of signals which may be electronic, electromagnetic, and optical or other signals capable of being received by communications interface. These signals are provided to communications interface via a communications path (e.g., channel). This channel carries signals and may be implemented using wire, cable, fiber optics, a telephone line, a cellular link, a radio frequency (RF) link, wireless and other communications channels.

The terms "computer program medium" and "computer usable medium" and "computer readable medium" are used to generally refer to media such as removable storage drive and a hard disk installed in hard disk drive. These computer program products provide software to computer system.

Computer programs (also referred to as computer control logic) are stored in main memory and/or secondary memory. Computer programs may also be received via communications interface. Such computer programs, when executed, enable the computer system to perform the features as discussed herein. In particular, the computer programs, when executed, enable the processor to perform the features of various embodiments. Accordingly, such computer programs represent controllers of the computer system.

In various embodiments, software may be stored in a computer program product and loaded into computer system using removable storage drive, hard disk drive or communications interface. The control logic (software), when executed by the processor, causes the processor to perform the functions of various embodiments as described herein. In various embodiments, hardware components such as application specific integrated circuits (ASICs) are implemented. Implementation of the hardware state machine so as to perform the functions described herein will be apparent to persons skilled in the relevant art(s).

The various system components may be independently, separately or collectively suitably coupled to the network via data links which includes, for example, a connection to an Internet Service Provider (ISP) over the local loop as is typically used in connection with standard modem communication, cable modem, Dish Networks®, ISDN, Digital Subscriber Line (DSL), or various wireless communication methods, see, e.g., GILBERT HELD, UNDERSTANDING DATA COMMUNICATIONS (1996), which is hereby incorporated by reference. It is noted that the network may be implemented as other types of networks, such as an interactive television (ITV) network. Moreover, the system contemplates the use, sale or distribution of any goods, services or information over any network having similar functionality described herein.

"Cloud" or "Cloud computing" includes a model for enabling convenient, on-demand network access to a shared pool of configurable computing resources (e.g., networks, servers, storage, applications, and services) that can be rapidly provisioned and released with minimal management effort or service provider interaction. Cloud computing may include location-independent computing, whereby shared servers provide resources, software, and data to computers and other devices on demand. For more information regarding cloud computing, see the NIST's (National Institute of Standards and Technology) definition of cloud computing at http://nvlpubs.nist.gov/nistpubs/Legacy/SP/nistspecialpublication800-145.pdf (last visited March 2017), which is hereby incorporated by reference in its entirety.

As used herein, "transmit" may include sending electronic data from one system component to another over a network connection. Additionally, as used herein, "data" may include encompassing information such as commands, queries, files, data for storage, and the like in digital or any other form.

The computers discussed herein may provide a suitable website or other Internet-based graphical user interface which is accessible by users. In one embodiment, the Microsoft Internet Information Server (IIS), Microsoft Transaction Server (MTS), and Microsoft SQL Server, are used in conjunction with the Microsoft operating system, Microsoft NT web server software, a Microsoft SQL Server database system, and a Microsoft Commerce Server. Additionally, components such as Access or Microsoft SQL Server, Oracle, Sybase, Informix MySQL, Interbase, etc., may be used to provide an Active Data Object (ADO) compliant database management system. In one embodiment, the Apache web server is used in conjunction with a Linux operating system, a MySQL database, and the Perl, PHP, and/or Python programming languages.

Any of the communications, inputs, storage, databases or displays discussed herein may be facilitated through a website having web pages. The term "web page" as it is used herein is not meant to limit the type of documents and applications that might be used to interact with the user. For example, a typical website might include, in addition to standard HTML documents, various forms, Java applets, JavaScript, active server pages (ASP), common gateway interface scripts (CGI), extensible markup language (XML), dynamic HTML, cascading style sheets (CSS), AJAX (Asynchronous Javascript And XML), helper applications, plug-ins, and the like. A server may include a web service that receives a request from a web server, the request including a URL (http://yahoo.com/stockquotes/ge) and an IP address (123.56.789.234). The web server retrieves the appropriate web pages and sends the data or applications for the web pages to the IP address. Web services are applications that are capable of interacting with other applications over a communications means, such as the internet. Web services are typically based on standards or protocols such as XML, SOAP, AJAX, WSDL and UDDI. Web services methods are well known in the art, and are covered in many standard texts. See, e.g., ALEX NGHIEM, IT WEB SERVICES: A ROADMAP FOR THE ENTERPRISE (2003), hereby incorporated by reference.

Practitioners will also appreciate that there are a number of methods for displaying data within a browser-based document. Data may be represented as standard text or within a fixed list, scrollable list, drop-down list, editable text field, fixed text field, popup window, and the like. Likewise, there are a number of methods available for modifying data in a web page such as, for example, free text entry using a keyboard, selection of menu items, check boxes, option boxes, and the like.

The system and method may be described herein in terms of functional block components, screen shots, optional selections and various processing steps. It should be appreciated that such functional blocks may be realized by any number of hardware and/or software components configured to perform the specified functions. For example, the system may employ various integrated circuit components, e.g., memory elements, processing elements, logic elements, look-up tables, and the like, which may carry out a variety of functions under the control of one or more microprocessors or other control devices. Similarly, the software elements of the system may be implemented with any programming or scripting language such as C, C++, C #, Java, JavaScript, VBScript, Macromedia Cold Fusion, COBOL, Microsoft Active Server Pages, assembly, PERL, PHP, awk, Python, Visual Basic, SQL Stored Procedures, PL/SQL, any UNIX shell script, and extensible markup language (XML) with the various algorithms being implemented with any combination of data structures, objects, processes, routines or other programming elements. Further, it should be noted that the system may employ any number of conventional techniques for data transmission, signaling, data processing, network control, and the like. Still further, the system could be used to detect or prevent security issues with a client-side scripting language, such as JavaScript, VBScript or the like. For a basic introduction of cryptography and network security, see any of the following references: (1) "Applied Cryptography: Protocols, Algorithms, And Source Code In C," by Bruce Schneier, published by John Wiley & Sons (second edition, 1995); (2) "Java Cryptography" by Jonathan Knudson, published by O'Reilly & Associates (1998); (3) "Cryptography & Network Security: Principles & Practice" by William Stallings, published by Prentice Hall; all of which are hereby incorporated by reference.

As will be appreciated by one of ordinary skill in the art, the system may be embodied as a customization of an existing system, an add-on product, a processing apparatus executing upgraded software, a standalone system, a distributed system, a method, a data processing system, a device for data processing, and/or a computer program product. Accordingly, any portion of the system or a module may take the form of a processing apparatus executing code, an internet based embodiment, an entirely hardware embodiment, or an embodiment combining aspects of the internet, software and hardware. Furthermore, the system may take the form of a computer program product on a computer-readable storage medium having computer-readable program code means embodied in the storage medium. Any suitable computer-readable storage medium may be utilized, including hard disks, CD-ROM, optical storage devices, magnetic storage devices, and/or the like.

The system and method is described herein with reference to screen shots, block diagrams and flowchart illustrations of methods, apparatus (e.g., systems), and computer program products according to various embodiments. It will be understood that each functional block of the block diagrams and the flowchart illustrations, and combinations of functional blocks in the block diagrams and flowchart illustrations, respectively, can be implemented by computer program instructions.

These computer program instructions may be loaded onto a programmable data processing apparatus to produce a machine, such that the instructions that execute on the computer or other programmable data processing apparatus create means for implementing the functions specified in the flowchart block or blocks. These computer program instructions may also be stored in a computer-readable memory that can direct a computer or other programmable data processing apparatus to function in a particular manner, such that the instructions stored in the computer-readable memory produce an article of manufacture including instruction means which implement the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions specified in the flowchart block or blocks.

Accordingly, functional blocks of the block diagrams and flowchart illustrations support combinations of means for performing the specified functions, combinations of steps for performing the specified functions, and program instruction means for performing the specified functions. It will also be understood that each functional block of the block diagrams and flowchart illustrations, and combinations of functional blocks in the block diagrams and flowchart illustrations, can be implemented by either special purpose hardware-based computer systems which perform the specified functions or steps, or suitable combinations of special purpose hardware and computer instructions. Further, illustrations of the process flows and the descriptions thereof may make reference to user windows, webpages, websites, web forms, prompts, etc. Practitioners will appreciate that the illustrated steps described herein may comprise in any number of configurations including the use of windows, webpages, web forms, popup windows, prompts and the like. It should be further appreciated that the multiple steps as illustrated and described may be combined into single webpages and/or windows but have been expanded for the sake of simplicity. In other cases, steps illustrated and described as single process steps may be separated into multiple webpages and/or windows but have been combined for simplicity.

The term "non-transitory" is to be understood to remove only propagating transitory signals per se from the claim scope and does not relinquish rights to all standard computer-readable media that are not only propagating transitory signals per se. Stated another way, the meaning of the term "non-transitory computer-readable medium" and "non-transitory computer-readable storage medium" should be construed to exclude only those types of transitory computer-readable media which were found in In Re Nuijten to fall outside the scope of patentable subject matter under 35 U.S.C. § 101.

Systems, methods and computer program products are provided. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Benefits, other advantages, and solutions to problems have been described herein with regard to specific embodiments. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to 'at least one of A, B, and C' or 'at least one of A, B, or C' is used in the claims or specification, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Although the disclosure includes a method, it is contemplated that it may be embodied as computer program instructions on a tangible computer-readable carrier, such as a magnetic or optical memory or a magnetic or optical disk. All structural, chemical, and functional equivalents to the elements of the above-described exemplary embodiments that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims.

Furthermore, no element, component, or method step in the present disclosure is intended to be dedicated to the public regardless of whether the element, component, or method step is explicitly recited in the claims. No claim element herein is to be construed under the provisions of 35 U.S.C. 112 (f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc., are not intended to limit the order of the steps; these words are simply used to guide the reader through the description of the methods. Although process flow diagrams may describe the operations as a sequential process, many of the operations can be performed in parallel or concurrently. In addition, the order of the operations may be rearranged. A process may correspond to a method, a function, a procedure, a subroutine, a subprogram, etc. When a process corresponds to a function, its termination may correspond to a return of the function to the calling function or the main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Embodiments implemented in computer software may be implemented in software, firmware, middleware, microcode, hardware description languages, or the like, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the invention. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module which may reside on a computer-readable or processor-readable storage medium. A non-transitory computer-readable or processor-readable media includes both computer storage media and tangible storage media that facilitate transfer of a computer program from one place to another. A non-transitory, processor-readable storage media may be any available media that may be accessed by a computer. By way of example, and not limitation, such non-transitory, processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory, processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

The invention claimed is:

1. A passenger safety system comprising:
a sensing unit configured to be installed proximate to a seat occupiable by a person,
wherein the sensing unit is a part of a securement system for securing the person in the seat; and
a fob comprising a portable electronic device to provide human readable indications corresponding to radio signals from the sensing unit received via a fob communication channel,
wherein the fob indicates at least one of a securement of a seat belt associated with the sensing unit, a temperature proximate to the sensing unit, and a distance of the fob from the sensing unit in response to the radio signals, and
wherein the fob comprises:
a fob transceiver configured to send and receive the radio signals to and from the sensing unit via the fob communication channel;
a fob controller connected to the fob transceiver and configured to detect a loss of communication of the fob transceiver with the sensing unit; and
a transceiver power controller configured to increase a transmitter power of the fob transceiver in response to the detected loss of communication of the fob transceiver with the sensing unit, whereby the fob transceiver regains communication with the sensing unit, and
wherein the fob controller provides a human readable indication that the fob has exceeded a predetermined range from the sensing unit in response to the loss of communication.

2. A passenger safety system comprising:
a sensing unit configured to be installed proximate to a seat occupiable by a person,
wherein the sensing unit is a part of a securement system for securing the person in the seat; and
a fob comprising a portable electronic device to provide human readable indications corresponding to radio signals from the sensing unit received via a fob communication channel,
wherein the fob indicates at least one of a securement of a seat belt associated with the sensing unit, a temperature proximate to the sensing unit, and a distance of the fob from the sensing unit in response to the radio signals, and
wherein the fob comprises an indicator array of visual indicators comprising:
a visual battery indicator configured to provide a visual indication of whether a battery of the fob is charged beyond a battery charge threshold;
a visual attachment indicator configured to provide a visual indication of whether one or more sensors of the sensing unit indicate the securement of a seat belt associated with the sensing unit;
a visual temperature indicator configured to provide a visual indication of whether a temperature proximate to the sensing unit is within an acceptable range; and
a visual fob range indicator configured to provide a visual indication of whether the fob has exceeded a predetermined range from the sensing unit.

3. A passenger safety system comprising:
a sensing unit configured to be installed proximate to a seat occupiable by a person,
   wherein the sensing unit is a part of a securement system for securing the person in the seat; and
a fob comprising a portable electronic device to provide human readable indications corresponding to radio signals from the sensing unit received via a fob communication channel,
wherein the fob indicates at least one of a securement of a seat belt associated with the sensing unit, a temperature proximate to the sensing unit, and a distance of the fob from the sensing unit in response to the radio signals, and
wherein the sensing unit comprises:
   a first attachment mechanism comprising a first shoulder strap of a child safety seat;
   a second attachment mechanism comprising a second shoulder strap of a child safety seat;
   a housing selectively connectable to the first attachment mechanism and the second attachment mechanism and having a release button configured to selectively disconnect the first attachment mechanism and the second attachment mechanism from the housing; and
   an attachment mechanism sensor array disposed in the housing to determine whether the first attachment mechanism is disconnected and to determine whether the second attachment mechanism is disconnected,
the sensing unit further comprising a fob proximity sensor, wherein the fob proximity sensor comprises a Bluetooth transceiver configured to detect a loss of connection with a Bluetooth transceiver of the fob.

4. A sensing unit of a passenger safety system, wherein the sensing unit comprises:
a first attachment mechanism comprising a first shoulder strap of a child safety seat;
a second attachment mechanism comprising a second shoulder strap of a child safety seat;
a housing selectively connectable to the first attachment mechanism and the second attachment mechanism and having a release button configured to selectively disconnect the first attachment mechanism and the second attachment mechanism from the housing;
an attachment mechanism sensor array disposed in the housing to determine whether the first attachment mechanism is disconnected and to determine whether the second attachment mechanism is disconnected; and
a radio transmitter configured to wirelessly communicate to at least one of a fob and a smartphone whether the first attachment mechanism is disconnected and to whether the second attachment mechanism is disconnected.

5. The sensing unit of the passenger safety system of claim 4, wherein the attachment mechanism sensor array comprises Hall-Effect sensors to determine whether the first attachment mechanism is disconnected and to determine whether the second attachment mechanism is disconnected.

6. The sensing unit of the passenger safety system of claim 4, the sensing unit further comprising a temperature sensor, and wherein the radio transmitter is further configured to wirelessly communication to at least one of a fob and a smartphone whether a temperature proximate to the child safety seat is within a predetermined acceptable range.

7. The sensing unit of the passenger safety system of claim 4, the sensing unit further comprising a sensing unit indicator array comprising LEDs selectably illuminable to indicate whether the first attachment mechanism is disconnected and whether the second attachment mechanism is disconnected.

8. A sensing unit of a passenger safety system, wherein the sensing unit comprises:
a first attachment mechanism comprising a first strap of a seat;
a second attachment mechanism comprising a second strap of a seat;
a housing selectively connectable to the first attachment mechanism and the second attachment mechanism and having a release button configured to selectively disconnect at least one of the first attachment mechanism and the second attachment mechanism from the housing;
an attachment mechanism sensor array to determine whether the first attachment mechanism is disconnected and to determine whether the second attachment mechanism is disconnected; and
a radio transmitter configured to wirelessly communicate to at least one of a fob and a smartphone whether the first attachment mechanism is disconnected and whether the second attachment mechanism is disconnected.

* * * * *